(12) United States Patent
Osano et al.

(10) Patent No.: US 8,058,636 B2
(45) Date of Patent: Nov. 15, 2011

(54) VARIABLE RESISTANCE NONVOLATILE MEMORY APPARATUS

(75) Inventors: Koichi Osano, Osaka (JP); Satoru Fujii, Osaka (JP); Shunsaku Muraoka, Osaka (JP)

(73) Assignee: Panasonic Corporation, Osaka (JP)

( * ) Notice: Subject to any disclaimer, the term of this patent is extended or adjusted under 35 U.S.C. 154(b) by 472 days.

(21) Appl. No.: 12/302,468

(22) PCT Filed: Mar. 27, 2008

(86) PCT No.: PCT/JP2008/000766
§ 371 (c)(1),
(2), (4) Date: Nov. 25, 2008

(87) PCT Pub. No.: WO2008/126365
PCT Pub. Date: Oct. 23, 2008

(65) Prior Publication Data
US 2009/0250678 A1   Oct. 8, 2009

(30) Foreign Application Priority Data

Mar. 29, 2007   (JP) ................................ 2007-086514

(51) Int. Cl.
*H01L 29/02* (2006.01)
*H01L 47/00* (2006.01)

(52) U.S. Cl. .................................. 257/2; 257/E47.001
(58) Field of Classification Search ........ 257/2, E47.001
See application file for complete search history.

(56) References Cited

U.S. PATENT DOCUMENTS

| 6,204,139 | B1 | 3/2001 | Liu et al. | |
|---|---|---|---|---|
| 7,050,327 | B2 * | 5/2006 | Campbell | 365/159 |
| 7,145,791 | B2 * | 12/2006 | Tsushima et al. | 365/148 |

(Continued)

FOREIGN PATENT DOCUMENTS

JP   263647   10/1995

(Continued)

OTHER PUBLICATIONS

Zhuang et al "Novell Colossal Magnetoresistive Thin Film Nonvolatile Resistance Random Acess Memory (RRAM)" Tech. Dig.—Int. Electron Devices Meet. IEEE 2002.

(Continued)

*Primary Examiner* — Ida M Soward
(74) *Attorney, Agent, or Firm* — McDermott Will & Emery LLP

(57) ABSTRACT

A nonvolatile memory apparatus includes a first electrode (111), a second electrode (112), a variable resistance layer (113) which is disposed between the electrodes, a resistance value of the variable resistance layer reversibly varying between a plurality of resistance states based on an electric signal applied between the electrodes, a first terminal (103) connected to the first electrode, and a second terminal (104) connected to the second terminal. The variable resistance layer comprises at least a tantalum oxide, and is configured to satisfy $0<x<2.5$ when the tantalum oxide is represented by TaOx; and wherein when a resistance value between the electrodes in a state where the variable resistance layer is in the low-resistance state is RL, a resistance value between the electrodes in a state where the variable resistance layer is in the high-resistance state is RH, and a resistance value of a portion other than the variable resistance layer in a current path connecting the first terminal to the second terminal via the first electrode, the variable resistance layer and the second electrode, is R0, R0 satisfies RL<R0.

5 Claims, 24 Drawing Sheets

U.S. PATENT DOCUMENTS

| | | | |
|---|---|---|---|
| 7,345,908 B2 * | 3/2008 | Hachino et al. | 365/148 |
| 7,521,705 B2 * | 4/2009 | Liu | 257/2 |
| 7,577,022 B2 * | 8/2009 | Muraoka et al. | 365/159 |
| 7,787,280 B2 * | 8/2010 | Mitani et al. | 365/148 |
| 2006/0002174 A1 * | 1/2006 | Hosoi et al. | 365/148 |
| 2007/0115714 A1 | 5/2007 | Muraoka et al. | |
| 2007/0159869 A1 * | 7/2007 | Baek et al. | 365/148 |
| 2007/0267621 A1 * | 11/2007 | Ufert | 257/4 |
| 2007/0297231 A1 * | 12/2007 | Gilton | 365/185.14 |
| 2008/0094874 A1 * | 4/2008 | Liaw | 365/148 |
| 2008/0258129 A1 * | 10/2008 | Toda | 257/5 |
| 2010/0273305 A1 * | 10/2010 | Klein | 438/382 |

FOREIGN PATENT DOCUMENTS

| | | |
|---|---|---|
| JP | 2004-349689 | 12/2004 |
| JP | 2004-363604 | 12/2004 |
| JP | 2005-216387 | 8/2005 |
| JP | 2006-032898 | 2/2006 |
| JP | 2006-040946 | 2/2006 |
| JP | 2006-229227 | 8/2006 |
| JP | 2006-351061 | 12/2006 |
| WO | WO 00/49659 | 8/2000 |
| WO | WO 2005/059921 A1 | 6/2005 |
| WO | WO 2007/013174 A1 | 2/2007 |
| WO | WO 2008/059701 A1 | 5/2008 |
| WO | WO 2008/059946 A1 | 5/2008 |

OTHER PUBLICATIONS

Baek et al "Multi-layer Cross-point Binary Oxide Resistive Memory (OxRRAM) for Post-NAND Storage Application" Tech. Dig.—Int. Electron Devices Meet. IEEE 2005.

Baek et al "Highly Scalable Non-Volatile Resistive Memroy using Simple Binary Oxide Driven by Asymmetric Unipolar Voltage Pulses" Tech. Dig.—Int. Electron Devices Meet. IEEE 2004.

Fujimoto et al "High-Speed Resistive Switching of $TiO_2$/TiN Nano-Crystalline Thin Film" pp. L310-L312 Japanese Journal of Applied Physics vol. 45 No. 11 The Japanese Society of Applied Physics 2006.

* cited by examiner (a)

(b)

VARIABLE RESISTANCE NONVOLATILE MEMORY APPARATUS

RELATED APPLICATIONS

This application is the US National Phase under 35 U.S.C. §371 of International Application No. PCT/JP2008/00766 filed on Mar. 27, 2008, which claims the benefit of Japanese Application No. JP2007-086514 filed on Mar. 29, 2007, the disclosures of which Applications are incorporated by reference herein.

TECHNICAL FIELD

The present invention relates to a nonvolatile memory apparatus, a nonvolatile memory element, and a nonvolatile memory element array. More particularly, the present invention relates to a resistance variable nonvolatile memory apparatus, a resistance variable nonvolatile memory element, and a resistance variable nonvolatile memory element array, whose resistance values vary according to electric signals applied.

BACKGROUND ART

With recent advancement of digital technologies, higher functionality of electronic hardware such as portable information devices and home information appliances have been brought out. For this reason, demands for an increase in a capacity of a nonvolatile memory element, a reduction in writing electric power, a reduction in write/read-out time, and longer life have been increasing.

In response to such demands, it is said that there is a limitation on miniaturization of an existing flash memory using a floating gate. On the other hand, a nonvolatile memory element (resistance variable memory) using a variable resistance layer as a material of a memory portion is attainable with a simple structure. Therefore, further minitualization, a higher-speed, and further electric power saving of the nonvolatile memory element are expected.

When using the variable resistance layer as the material of the memory portion, its resistance value varies from a high-resistance value to a low-resistance value or from the low-resistance value to the high-resistance value, for example, by inputting electric pulses. In this case, it is necessary to clearly distinguish two values, i.e., the high-resistance value and the low-resistance value, to vary the resistance value stably between the low-resistance value and the high-resistance value at a high-speed, and to hold these two values in a nonvolatile manner. For the purpose of stabilization of such a memory property and minitualization of memory elements, a variety of proposals have been proposed in the past.

As one of such proposals, patent document 1 discloses a memory element in which memory cells are formed by resistance variable elements each of which includes two electrodes and a storing layer sandwiched between these electrodes and is configured to reversibly vary a resistance value of the storing layer. FIG. 27 is a cross-sectional view showing a configuration of such a conventional memory element.

As shown in FIG. 27, the memory element has a configuration in which a plurality of resistance variable elements 10 forming memory cells are arranged in array. The resistance variable element 10 has a configuration in which a high-resistance film 2 and an ion source layer 3 are sandwiched between a second electrode 1 and a first electrode 4. The high-resistance film 2 and the ion source layer 3 form a storing layer. The storing layer enables data to be stored in the resistance variable element 10 in each memory cell.

The resistance variable elements 10 are disposed above MOS transistors 18 formed on a semiconductor substrate 11. The MOS transistor 18 includes source/drain regions 13 formed in a region separated by an element separating layer 12 inside the semiconductor substrate 11 and a gate electrode 14. The gate electrode 14 also serves as a word line which is one address wire of the memory element.

One of the source/drain regions 13 of the MOS transistor 18 is electrically connected to the second electrode 1 of the resistance variable element 10 via a plug layer 15, a metal wire layer 16, and a plug layer 17. The other of the source/drain regions 13 of the MOS transistor 18 is connected to the metal wire layer 16 via the plug layer 15. The metal wire layer 16 is connected to a bit line which is the other address wire of the memory element.

By applying electric potentials of different polarities between the second electrode 1 and the first electrode 4 of the resistance variable element 10 configured as described above, ion source of the ion source layer 3 forming the storing layer is caused to migrate to the high-resistance layer 2. Or, the ion source is caused to migrate from the high-resistance layer 2 to the first electrode 4. Thereby, the resistance value of the resistance variable element 10 transitions from a value of a high-resistance state to a value of a low-resistance state, or from a value of the low-resistance state to a value of the high-resistance state, so that data is stored.

A memory element (phase-change type memory) is also known, in which a variable resistance material sandwiched between a first electrode and a second electrode forms a first electric pulse varying resistance layer having a polycrystalline structure and a second electric pulse varying resistance layer having a nano crystal or an amorphous structure. The resistance layer formed of the variable resistance material is controlled so that its resistance value is caused to vary according to a voltage and a pulse width of electric pulses applied, thereby operating as a resistance variable element (see, for example, patent document 2).

A perovskite material (e.g., $Pr_{(1-x)}Ca_xMnO_3$ (PCMO), $LaSrMnO_3$ (LSMO), $GdBaCo_xO_Y$ (GBCO) or the like) may be used as the variable resistance material of the nonvolatile memory element, because its resistance value varies according to electric pulses applied (patent document 3). In this nonvolatile memory element, a predetermined electric pulse is applied to the perovskite material to increase or decrease its resistance value, and different numeric values are stored according to the resulting varying resistance values. PCMO is writable with electric pulses having a pulse width of 100 nsec or smaller and is therefore expected to operate as a high-speed nonvolatile memory element (non-patent document 1).

However, the perovskite material has a complex composition and is not always compatible with a CMOS process. As a configuration suitable for the CMOS process, a nonvolatile memory element using as the variable resistance material a transition metal oxide (Ni—O, Ti—O, Hf—O, Zr—O) having a simple composition has been proposed (non-patent document 2). Patent document 4 discloses as the variable resistance material, $NiO$, $V_2O_5$, $ZnO$, $Nb_2O_5$, $TiO_2$, $WO_3$, or $CoO$. These materials consist of two elements and therefore, composition control therefor and film forming using them are relatively easy. In addition, these materials may have relatively high affinity with a semiconductor manufacturing process.

Patent document 5 discloses a variety of variable resistance materials obtained by rapid metal-insulator transfer of a p-type oxide semiconductor material comprising metal elements including tantalum. In particular, specific examples thereof are Ga, As and $VO_2$. Patent documents 6 and 7 disclose, as examples of a variable resistance material, titanium oxide and $Ta_2O_5$ which is tantalum oxide as insulators whose resistance states change, respectively.

As used herein, an electric pulse for changing the element from the high-resistance state to the low-resistance state is referred to as a low-resistance state attaining pulse, and an electric pulse for changing the element from the low-resistance state to the high-resistance state is referred to as a high-resistance state attaining pulse.

Desirably, the resistance value of the resistance variable memory element in the low-resistance state does not vary even when the low-resistance state attaining pulse is applied thereto. However, a problem arises, in which, when amorphous rare earth metal is used as the variable resistance material, the resistance value of the resistance variable memory element in the low-resistance state varies if the low-resistance attaining pulse is applied thereto. To solve such a problem, patent document 7 discloses a configuration for connecting an electric load to the variable resistance memory element.

Control is easily executed when the difference (switching window) in voltage between the low-resistance state attaining pulse and the high-resistance state attaining pulse is larger. Patent document 8 discloses that a resistor portion is provided in a resistance variable memory element so that the difference in voltage between the low-resistance state attaining pulse and the high-resistance state attaining pulse is made larger.
Patent document 1: Japanese Laid-Open Patent Application Publication No. 2006-40946
Patent document 2: Japanese Laid-Open Patent Application Publication No. 2004-349689
Patent document 3: U.S. Pat. No. 6,204,139 Specification
Patent document 4: Japanese Laid-Open Patent Application Publication No. 2004-363604
Patent document 5: Japanese Laid-Open Patent Application Publication No. 2006-32898
Patent document 6: Japanese Laid-Open Patent Application Publication No. Hei. 7-263647
Patent document 7: Japanese Laid-Open Patent Application Publication No. 2005-216387
Patent document 8: Japanese Laid-Open Patent Application Publication No. 2006-229227
Non-patent document 1: Zuang, W. W. et al., 2002, "Novell Colossal Magnetoresistive Thin Film Nonvolatile Resistance Random Access Memory (RRAM)", IEDM Technical Digest
Non-patent document 2: Baek, J. G. et al., 2005, "Multi-layer Cross-point Binary Oxide Resistive Memory (OxRRAM) for Post-NAND Storage Application", IEDM Technical Digest
Non-patent document 3 Baek, J. G. et al., 2004, "Highly Scalable Non-volatile Resistive Memory using Simple Binary Oxide Driven by Asymmetric Unipolar Voltage Pulses", IEDM Technical Digest, pp. 587-590
Non-patent document 4 Japanese Journal of Applied Physics, vol. 45, no. 11, 2006, pp. L310-L312, FIG. 2

DISCLOSURE OF THE INVENTION

Problems to be Solved by the Invention

Forming the nonvolatile memory element using the variable resistance material illustrated in the non-patent document 2 or the patent document 4 arises the following problems.

When using the transition metal oxide such as NiO, a long pulse of $\mu$ sec order is required to change the variable resistance material from the low-resistance state to the high-resistance state. Therefore, a problem that a higher-speed is difficult to achieve arises.

When using $TiO_2$ as the variable resistance material, TiN is required to be oxidized in oxygen atmosphere at 400° C. to form a $TiO_2$/TiN film structure. Therefore, a problem that a relatively high process temperature must be used arises.

When using $Ta_2O_5$ as the transition metal material, it serves as an anti fuse which is usable only in one operation from the high-resistance state to the low-resistance state. Therefore, a problem that rewriting cannot be performed arises.

The present invention is made in view of the circumstances, and an object of the present invention is to provide a nonvolatile memory apparatus, a nonvolatile memory element, and a nonvolatile memory element array, which are capable of high-speed operation and have a stably reversible rewrite characteristic using a material which has high affinity with a semiconductor manufacturing process.

Means for Solving the Problems

The inventors of the present invention intensively studied to achieve the above described objective. As a result, it was found out that the resistance value of Ta oxide (TaOx: 0<x<2.5) reversibly varies by application of electric pulses having a short pulse width of 100 nsec or smaller. This enables a higher-speed operation. In addition, Ta is a time-proven material to be used in a semiconductor field and has high affinity with the conventional semiconductor manufacturing process. This implies that memory elements and memory element arrays which achieve high-speed and have large capacities can be supplied at a low cost, by using TaOx as the variable resistance material.

When using TaOx, the event that an amount of variation in the resistance value significantly changes according to a pulse width of electric pulses did not occur (to be described later in detail, see FIG. 16). The resistance value of TaOx in the high-resistance state did not vary even when the high-resistance state attaining pulse was applied thereto, while the resistance value of TaOx in the low-resistance state did not vary even when the low-resistance state attaining pulse was applied thereto (to be described later in detail, see FIG. 17). Therefore, an objective that variations in the resistance value after application of the electric pulses should be prevented does not arise. In view of this, the configuration disclosed in the patent document 7 is unnecessary.

In TaOx, the difference between the voltage (+2.5V) for changing TaOx from the high-resistance state to the low-resistance state and the voltage (−3V) for changing TaOx from the low-resistance state to the high-resistance state was sufficiently large (to be described later in detail). Therefore, an objective that reliability of an operation should be improved from the view point of an electric potential of a write pulse does not arise. In view of this, the configuration disclosed in the patent document 8 is unnecessary.

On the other hand, it was found out that, merely using a configuration in which a layer made of TaOx is sandwiched between electrodes results in inadequate operation stability. To be specific, it was evident that, using this configuration, some are able to withstand writing of 20000 times or more, but there is a relatively high probability that the resistance value drops irreversibly (dielectric breakdown or so-called breakdown, (hereinafter simply referred to as breakdown) occurs) by writing of about several hundreds times. The nonvolatile memory element in which the breakdown has occurred once does not return to the high-resistance state even if the high-resistance state attaining pulse is thereafter applied thereto. In order to put the nonvolatile memory element using TaOx as the resistance variable material into practice, it was necessary to attain a configuration which makes it possible to stably repeat the high-resistance state and the low-resistance state, irrespective of writing performed many times.

The inventors of the present invention intensively studied in order to stabilize the operation of the nonvolatile memory element using TaOx as the resistance variable material. As a result, it was found out that the breakdown can be effectively prevented by providing a resistor in series with the nonvolatile memory element.

To achieve the above described objective, to be specific, a nonvolatile memory apparatus of the present invention comprises a first electrode; a second electrode; a variable resistance layer which is disposed between the first electrode and the second electrode, a resistance value of the variable resistance layer reversibly varying between a plurality of resistance states based on an electric signal applied between the first electrode and the second electrode, the plurality of resistance states including a low-resistance state and a high-resistance state whose resistance value is higher than a resistance value of the low-resistance state; a first terminal connected to the first electrode; and a second terminal connected to the second electrode; wherein the variable resistance layer comprises at least a tantalum oxide, and is configured to satisfy 0<x<2.5 when the tantalum oxide is represented by TaOx; and wherein when a resistance value between the first electrode and the second electrode in a state where the variable resistance layer is in the low-resistance state is RL, a resistance value between the first electrode and the second electrode in a state where the variable resistance layer is in the high-resistance state is RH, and a resistance value of a portion other than the variable resistance layer in a current path connecting the first terminal to the second terminal via the first electrode, the variable resistance layer and the second electrode, is R0, R0 satisfies RL<R0.

In such a configuration, the break down which tends to occur when the variable resistance layer is changed from the high-resistance state to the low-resistance state can be prevented. Therefore, a nonvolatile memory apparatus and a nonvolatile memory element, which are capable of high-speed operation and have a stably reversible rewrite characteristic using a material which has high affinity with a semiconductor manufacturing process are attained.

In the nonvolatile memory apparatus, the variable resistance layer may comprise at least a tantalum oxide, and is configured to satisfy 0<x≦1.9 when the tantalum oxide is represented by TaOx.

In the nonvolatile memory apparatus, the variable resistance layer may comprises at least a tantalum oxide, and is configured to satisfy 0.5≦x≦1.9 when the tantalum oxide is represented by TaOx.

In the nonvolatile memory apparatus, the variable resistance layer may comprise at least a tantalum oxide, and is configured to satisfy 0.8≦x≦1.9 when the tantalum oxide is represented by TaOx.

A nonvolatile memory element of the present invention comprises a first electrode; a second electrode; and a variable resistance layer which is disposed between the first electrode and the second electrode, a resistance value of the variable resistance layer reversibly varying based on an electric signal applied between the first electrode and the second electrode; wherein the variable resistance layer comprises a tantalum oxide, and is configured to satisfy 0<x<2.5 when the tantalum oxide is represented by TaOx; and wherein a fixed resistance portion is provided in series with the variable resistance layer.

In such a configuration, also, the break down which tends to occur when the variable resistance layer is changed from the high-resistance state to the low-resistance state can be prevented. Therefore, a nonvolatile memory apparatus and a nonvolatile memory element, which are capable of high-speed operation and have a stably reversible rewrite characteristic using a material which has high affinity with a semiconductor manufacturing process are attained.

In the nonvolatile memory apparatus, a resistor may be provided in series with the variable resistance layer in the current path; and wherein when a resistance value of the resistor is R0, R0 may satisfy RL<R0.

In such a configuration, the resistance of the current path can be easily controlled by using the resistor.

A nonvolatile memory element array of the present invention comprises a semiconductor substrate; a plurality of first electrode wires formed on the semiconductor substrate to extend in parallel with each other within a plane parallel to a main surface of the semiconductor substrate; a plurality of second electrode wires formed on the semiconductor substrate to extend in parallel with each other within a plane parallel to the main surface of the semiconductor substrate and to three-dimensionally cross the plurality of first electrode wires; and nonvolatile memory elements provided to respectively correspond to three-dimensional cross points of the plurality of first electrode wires and the plurality of second electrode wires; wherein each of the nonvolatile memory elements includes a nonvolatile memory portion and a fixed resistance portion which are provided in series to connect an associated one of the first electrode wires and an associated one of the second electrode wires; and wherein the nonvolatile memory portion includes a first electrode, a second electrode, and a variable resistance layer which is disposed between the first electrode and the second electrode, a resistance value of the variable resistance layer reversibly varying between a plurality of resistance states based on an electric signal applied between the first electrode and the second electrode, the plurality of resistance states including a low-resistance state and a high-resistance state whose resistance value is higher than a resistance value of the low-resistance state; wherein the variable resistance layer comprises a tantalum oxide, and is configured to satisfy 0<x<2.5 when the tantalum oxide is represented by TaOx; and wherein when a resistance value between the first electrode and the second electrode in a state where the variable resistance layer is in the low-resistance state is RL, a resistance value between the first electrode and the second electrode in a state where the variable resistance layer is in the high-resistance state is RH, and a resistance value of the fixed resistance portion is R0, R0 satisfies RL<R0.

In such a configuration, a nonvolatile memory apparatus which has a large capacity and is small-sized is attained by using a cross-point type nonvolatile memory element array.

A nonvolatile memory element array of the present invention comprise a semiconductor substrate; a plurality of first electrode wires formed on the semiconductor substrate to extend in parallel with each other within a plane parallel to a main surface of the semiconductor substrate; a plurality of second electrode wires formed on the semiconductor substrate to extend in parallel with each other within a plane parallel to the main surface of the semiconductor substrate and to three-dimensionally cross the plurality of first electrode wires; and nonvolatile memory elements provided to respectively correspond to three-dimensional cross points of the plurality of first electrode wires and the plurality of second electrode wires and are each configured to connect an associated one of the first electrode wires and an associated one of the second electrode wires; and resistors respectively provided on either the plurality of first electrode wires or the plurality of second electrode wires; wherein each of the nonvolatile memory element includes a first electrode, a second electrode, and a variable resistance layer which is disposed between the first electrode and the second electrode, a resistance value of the variable resistance layer reversibly varying between a plurality of resistance states based on an electric signal applied between the first electrode and the second electrode, the plurality of resistance states including a low-resistance state and a high-resistance state whose resistance value is higher than a resistance value of the low-resistance state; wherein the variable resistance layer comprises a tantalum oxide, and is configured to satisfy $0<x<2.5$ when the tantalum oxide is represented by $TaO_x$; and wherein when a resistance value between the first electrode and the second electrode in a state where the variable resistance layer is in the low-resistance state is RL, a resistance value between the first electrode and the second electrode in a state where the variable resistance layer is in the high-resistance state is RH, and a resistance value of the resistor is R0, R0 satisfies RL<R0.

In such a configuration, a nonvolatile memory apparatus which has a large capacity and is small-sized is attained by using a cross-point type nonvolatile memory element array. Furthermore, since it is not necessary to provide the resistor for each memory cell, manufacturing thereof becomes easier.

A nonvolatile memory element array of the present invention comprise a semiconductor substrate; a plurality of bit lines formed on the semiconductor substrate to extend in parallel with each other within a plane parallel to a main surface of the semiconductor substrate; a plurality of word lines formed on the semiconductor substrate to extend within a plane parallel to the main surface of the semiconductor substrate and to three-dimensionally cross the plurality of bit lines; a plurality of plate lines formed on the semiconductor substrate so as to extend in parallel with each other within a plane parallel to the main surface of the semiconductor substrate, so as to respectively correspond to the plurality of word lines, and so as to three-dimensionally cross the plurality of bit lines; and transistors and nonvolatile memory elements, wherein each of the transistors and an associated one of the nonvolatile memory elements are provided in series to correspond to a three-dimensional cross point of an associated one of the plurality of bit lines and an associated one of the plurality of word lines and to connect an associated one of the bit lines and an associated one of the plate lines; wherein each of the transistors includes at least one control terminal and two main terminals, the control terminal is connected to an associated one of the word lines, and the two main terminals are provided to electrically connect an associated one of the bit lines and an associated one of the plate lines; wherein each of the nonvolatile memory elements includes a nonvolatile memory portion and a fixed resistance portion which are connected in series; wherein the nonvolatile memory portion includes a first electrode, a second electrode, and a variable resistance layer which is disposed between the first electrode and the second electrode, a resistance value of the variable resistance layer reversibly varying between a plurality of resistance states based on an electric signal applied between the first electrode and the second electrode via an associated one of the transistors, the plurality of resistance states including a low-resistance state and a high-resistance state whose resistance value is higher than a resistance value of the low-resistance state; wherein the variable resistance layer comprises a tantalum oxide, and is configured to satisfy $0<x<2.5$ when the tantalum oxide is represented by $TaO_x$; and wherein when a resistance value between the first electrode and the second electrode in a state where the variable resistance layer is in the low-resistance state is RL, a resistance value between the first electrode and the second electrode in a state where the variable resistance layer is in the high-resistance state is RH, and a resistance value of the fixed resistance portion is R0, R0 satisfies RL<R0.

In such a configuration, crosstalk or a leak current can be suppressed by using a 1T1R type nonvolatile memory element array. Therefore, a nonvolatile memory element array which stably operates is easily attained.

A nonvolatile memory element array of the present invention comprises a semiconductor substrate; a plurality of bit lines formed on the semiconductor substrate to extend in parallel with each other within a plane parallel to a main surface of the semiconductor substrate; a plurality of word lines formed on the semiconductor substrate to extend within a plane parallel to the main surface of the semiconductor substrate and to three-dimensionally cross the plurality of bit lines; a plurality of plate lines formed on the semiconductor substrate so as to extend in parallel with each other within a plane parallel to the main surface of the semiconductor substrate, so as to respectively correspond to the plurality of word lines, and so as to three-dimensionally cross the plurality of bit lines; transistors and nonvolatile memory elements, wherein each of the transistors and an associated one of the nonvolatile memory elements are provided in series to correspond to a three-dimensional cross point of an associated one of the plurality of bit lines and an associated one of the plurality of word lines and to connect an associated one of the bit lines and an associated one of the plate lines; and resistors respectively provided on either the plurality of bit lines or the plurality of plate lines; wherein each of the transistors includes at least one control terminal and two main terminals, the control terminal is connected to an associated one of the word lines, and the two main terminals are provided to electrically connect an associated one of the bit lines and an associated one of the plate lines; wherein each of the nonvolatile memory elements includes a first electrode, a second electrode, and a variable resistance layer which is disposed between the first electrode and the second electrode, a resistance value of the variable resistance layer reversibly varying between a plurality of resistance states based on an electric signal applied between the first electrode and the second electrode via an associated one of the transistors, the plurality of resistance states including a low-resistance state and a high-resistance state whose resistance value is higher than a resistance value of the low-resistance state; wherein the variable resistance layer comprises a tantalum oxide, and is configured to satisfy $0<x<2.5$ when the tantalum oxide is represented by $TaO_x$; and wherein when a resistance value between the first electrode and the second electrode in a state where the variable resistance layer is in the low-resistance state is RL, a resistance value between the first electrode and the second electrode in a state where the variable resistance layer is in the high-resistance state is RH, and a resistance value of the resistor is R0, R0 satisfies RL<R0.

In such a configuration, crosstalk or a leak current can be suppressed by using a 1T1R type nonvolatile memory element array. Therefore, a nonvolatile memory element array which stably operates is easily attained. Furthermore, since it is not necessary to provide the resistor for each cell, manufacturing thereof becomes easier.

A nonvolatile memory element array of the present invention comprises a semiconductor substrate; a plurality of bit lines formed on the semiconductor substrate to extend in parallel with each other within a plane parallel to a main surface of the semiconductor substrate; a plurality of word lines formed on the semiconductor substrate to extend within a plane parallel to the main surface of the semiconductor substrate and to three-dimensionally cross the plurality of bit lines; a plurality of plate lines formed on the semiconductor substrate so as to extend in parallel with each other within a plane parallel to the main surface of the semiconductor substrate, to respectively correspond to the plurality of word lines, and so as to three-dimensionally cross the plurality of bit lines; and transistors and nonvolatile memory elements, wherein each of the transistors and an associated one of the nonvolatile memory elements are provided in series to correspond to a three-dimensional cross point of an associated one of the plurality of bit lines and an associated one of the plurality of word lines and to connect an associated one of the bit lines and an associated one of the plate lines; wherein each of the nonvolatile memory elements includes a first electrode, a second electrode, and a variable resistance layer which is disposed between the first electrode and the second electrode, a resistance value of the variable resistance layer reversibly varying between a plurality of resistance states based on an electric signal applied between the first electrode and the second electrode via an associated one of the transistors, the plurality of resistance states including a low-resistance state and a high-resistance state whose resistance value is higher than a resistance value of the low-resistance state; wherein the variable resistance layer comprises a tantalum oxide, and is configured to satisfy 0<x<2.5 when the tantalum oxide is represented by TaOx; and wherein when a resistance value between the first electrode and the second electrode in a state where the variable resistance layer is in the low-resistance state is RL, a resistance value between the first electrode and the second electrode in a state where the variable resistance layer is in the high-resistance state is RH, and a resistance value of the transistor in an ON-state is R0, R0 satisfies RL<R0.

In such a configuration, also, crosstalk or a leak current can be suppressed by using a 1T1R type nonvolatile memory element array. Therefore, a nonvolatile memory element array which stably operates is easily attained. Furthermore, since the ON-resistance of the transistor is utilized in place of the resistor, its configuration is simplified, and manufacturing thereof becomes easier.

Foregoing object, other object, features, and advantages of the present invention will be apparent from the following detailed description of the preferred embodiments with reference to accompanying drawings.

Effects of the Invention

In accordance with the present invention, a nonvolatile memory apparatus, a nonvolatile memory element, and a nonvolatile memory element array which are capable of high-speed operation and have a stably reversible rewrite characteristic using a material which has high affinity with a semiconductor manufacturing process are attained.

BRIEF DESCRIPTION OF THE DRAWINGS

FIG. 9 is a view showing an electric characteristic of the nonvolatile memory element, wherein FIG. 9(a) is a view showing a current-voltage characteristic of the nonvolatile memory element according to Embodiment 1 of the present invention, and FIGS. 9(b) and 9(c) are views showing current-voltage characteristics of the nonvolatile memory element according to Comparative example 1 and Comparative example 2, respectively;

FIG. 10 is a view showing results of Auger analysis, wherein FIG. 10(a) is a view showing a result of the Auger analysis in a depth direction of a sample which is the variable resistance layer included in the nonvolatile memory element according to Embodiment 1 of the present invention and shows the resistance varying phenomenon as described above and FIG. 10(b) is a view showing a result of the Auger analysis in a depth direction of sample metal Ta which does not show the resistance varying phenomenon as described above;

EXPLANATION OF REFERENCE NUMERALS

Figure 1:
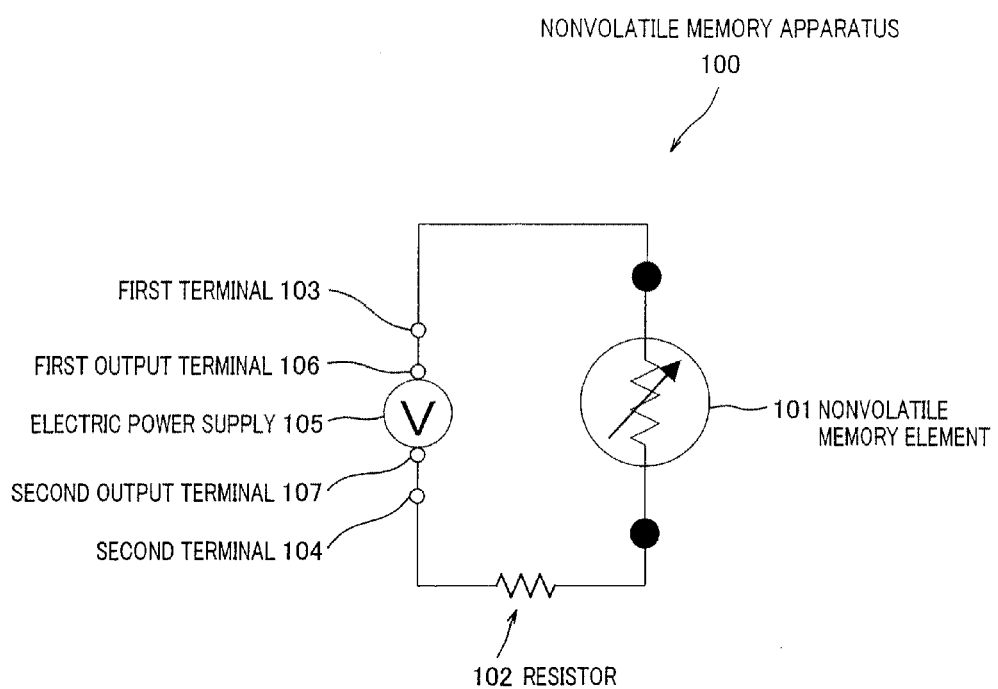
FIG. 1 is a circuit diagram showing an example of a configuration of a nonvolatile memory apparatus according to Embodiment 1 of the present invention.

100 nonvolatile memory apparatus
101 nonvolatile memory element
102 resistor
103 first terminal
104 second terminal
105 electric power supply
106 first output terminal
107 second output terminal
108 nonvolatile memory element
109 resistance element
111 first electrode
112 second electrode
113 variable resistance layer
114 metal layer
115 fixed resistance layer
120 substrate
130 nonvolatile memory apparatus
200 nonvolatile memory apparatus
201 memory main body
202 memory array
203 row selection circuit/driver
204 column selection circuit/driver
205 write circuit
206 sense amplifier
207 data input/output circuit
208 address input circuit
209 control circuit
300 nonvolatile memory apparatus
301 memory main body
302 memory array
303 row selection circuit/driver
304 column selection circuit
305 write circuit
306 sense amplifier
307 data input/output circuit
308 cell plate electric power supply
309 address input circuit
310 control circuit
BL0, BL1, . . . bit line
WL0, WL1 . . . word line
PL0, PL1 . . . plate line
M111, M112 . . . memory cell
T11, T12, . . . transistor
VR 111, VR112, . . . nonvolatile memory portion
FR 111, FR112, . . . fixed resistance portion
VR111', VR112' . . . nonvolatile memory element
FR20, FR21 . . . fixed resistance element
M211, M212 . . . memory cell
VR211, VR212, . . . nonvolatile memory portion
FR211, FR212, . . . fixed resistance portion
D211, D212, . . . rectifier element
VR 211', VR212', . . . nonvolatile memory element
FR30, FR31, . . . fixed resistance element

BEST MODE FOR CARRYING OUT THE INVENTION

Hereinafter, embodiments of the present invention will be described in detail with reference to the drawings. Throughout the drawings, the same reference numerals are assigned to the same or corresponding parts, which will not be described in some cases.

Embodiment 1

Configuration of Nonvolatile Memory Apparatus and Nonvolatile Memory Element

Figure 2:
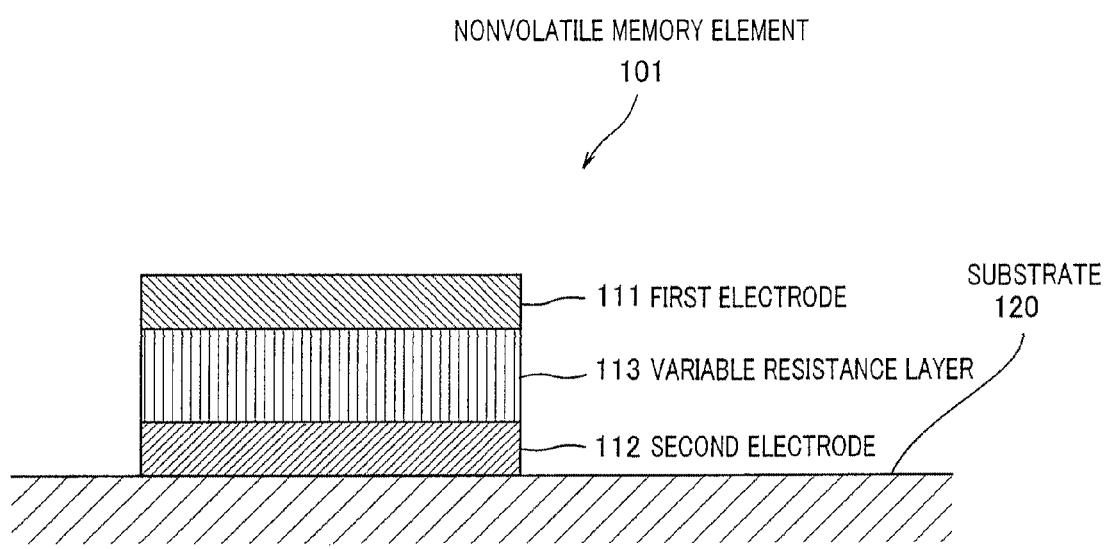
FIG. 2 is a cross-sectional view showing an example of a configuration of the nonvolatile memory element according to Embodiment 1 of the present invention.

FIG. 1 is a circuit diagram showing an example of a configuration of a nonvolatile memory apparatus according to Embodiment 1 of the present invention. FIG. 2 is a cross-sectional view showing an example of the nonvolatile memory element of FIG. 1.

As shown in FIG. 1, a nonvolatile memory apparatus 100 of this embodiment includes a nonvolatile memory element 101, a resistor 102, a first terminal 103, and a second terminal 104.

As shown in FIG. 1, when the nonvolatile memory apparatus 100 is used, an electric power supply (electric pulse application unit) 105 is connected between the first terminal 103 and the second terminal 104. The electric power supply 105 has a first output terminal 106 and a second output terminal 107. The first output terminal 106 and the first terminal 103 are connected to each other. The second output terminal 107 and the second terminal are connected to each other. In such a configuration, an electric pulse output from the electric power supply 105 between the first output terminal 106 and the second output terminal 107 is applied to the nonvolatile memory element 101 and the resistor 102 via the first terminal 103 and the second terminal 104.

As shown in FIG. 2, the nonvolatile memory element 101 includes a second electrode 112 formed on a substrate 120 to form a layer, a variable resistance layer 113 formed on the second electrode 112 to form a layer, and a first electrode 111 formed on the variable resistance layer 113 to form a layer. Although not shown in FIG. 2, for example, the second electrode 112 is connected to the second terminal 104, and the first electrode 111 is connected to the first terminal 103. In such a configuration, the electric pulse output from the electric power supply 105 is applied to the variable resistance layer 113 via the first electrode 111 and the second electrode 112.

By applying a predetermined electric pulse between the first electrode 111 and the second electrode 112, the variable resistance layer 113 is caused to transition reversibly between a low-resistance state in which a resistance value (value of electric resistance, hereinafter expressed as such) is RL and a high-resistance state in which the resistance value is RH. Hereinafter, it is assumed that the resistance values of the electrodes are negligible.

The resistor 102 may have any configuration so long as it has a predetermined resistance value, and may be, for example, a resistor such as a fixed resistance element or ON-resistance of a transistor, or a wiring resistor. To suppress break down occurring in the nonvolatile memory element 101, it is desired that a resistance value R0 of the resistor 102 be substantially equal to or higher than RL, and to be precise, R0>RL. On the other hand, if R0 is made larger, a total resistance value of the nonvolatile memory element 101 and the resistor 102 becomes larger, lessening a difference between the high-resistance state and the low-resistance state. If the difference in resistance value between the two states becomes too small, an error is undesirably likely to occur in reading out of the resistance state. Therefore, it is desired that R0 be set to ⅕ of RH or less, for example. That is, it is desired that R0 satisfy RL<R0<(RH/5). When R0=(RH/5), a total resistance value of the nonvolatile memory element 101 and the resistor 102 is about ⅕ of RH in the low-resistance state because RL is sufficiently low and is about ⅚ of RH in the high-resistance state, and thus, a difference which is five times or larger is obtained as a ratio of the resistance value. By satisfying R0<(RH/5), it is possible to suppress an error occurring in reading out the resistance state.

Figure 3:
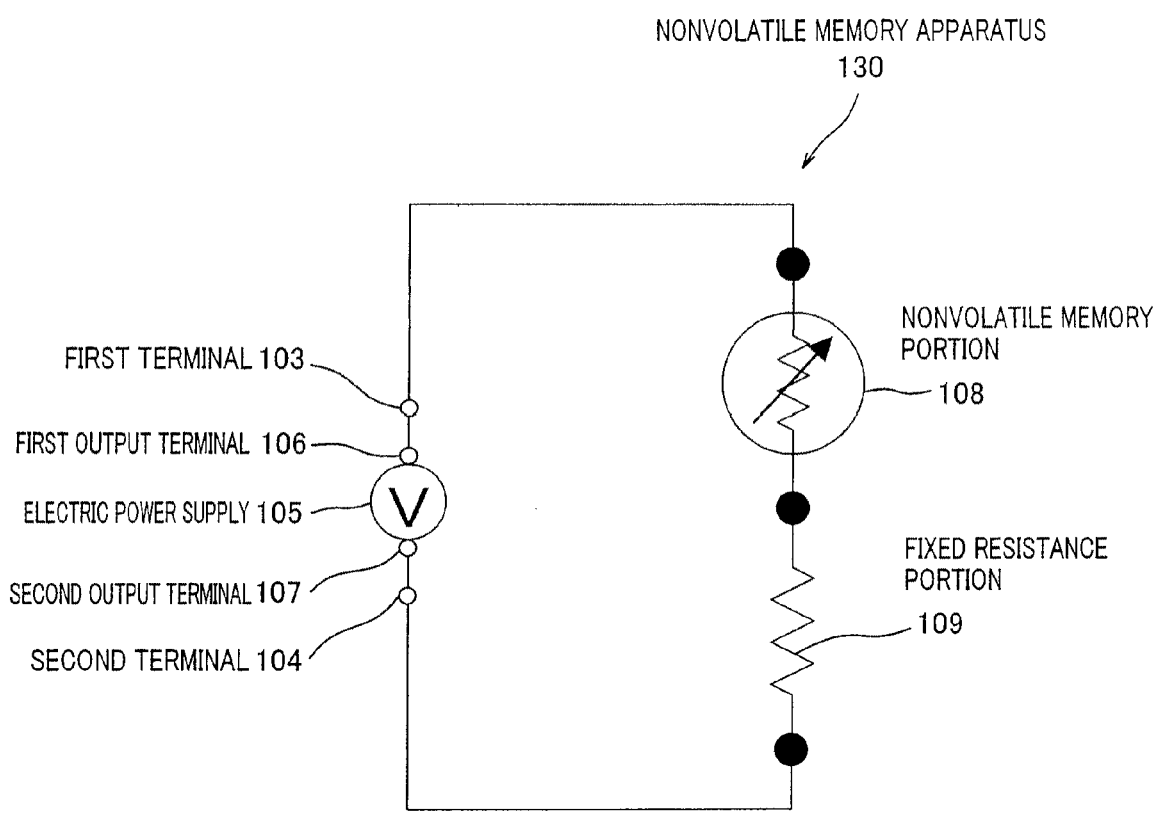
FIG. 3 is a circuit diagram showing an example of a configuration of a nonvolatile memory apparatus in a case where a fixed resistance portion is formed on the same substrate in Embodiment 1 of the present invention.
Figure 4:
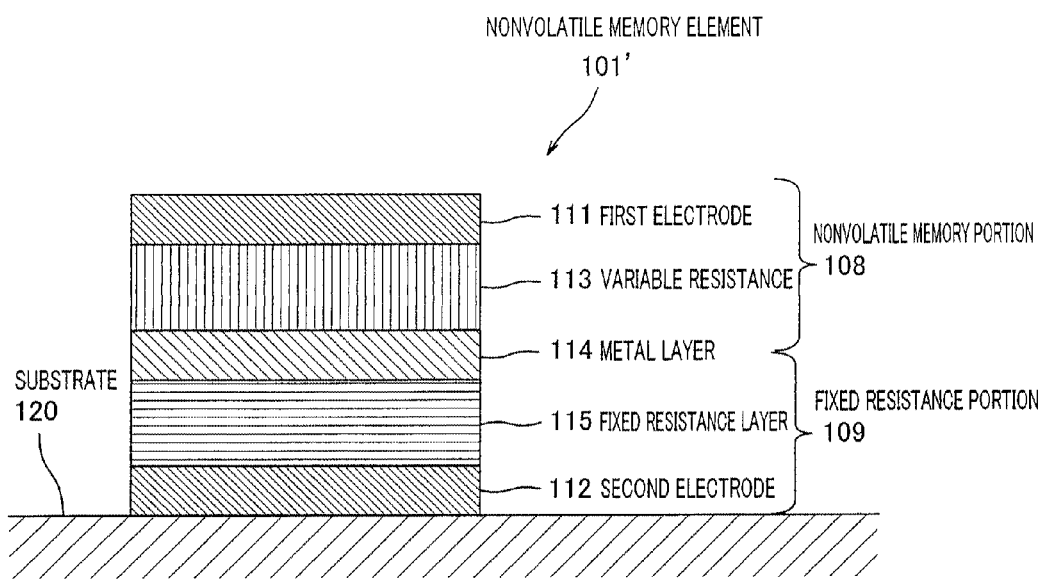
FIG. 4 is a cross-sectional view showing an example of a configuration of a nonvolatile memory element in a case where the fixed resistance portion is formed on the same substrate in Embodiment 1 of the present invention.

FIG. 3 is a circuit diagram showing an example of a configuration of a nonvolatile memory apparatus in a case where a fixed resistance portion is formed on the same substrate in Embodiment 1 of the present invention. FIG. 4 is a cross-sectional view showing an example of a configuration of a nonvolatile memory element in a case where the fixed resistance portion is formed on the same substrate in Embodiment 1 of the present invention.

As shown in FIG. 4, when the fixed resistance portion is formed on the same substrate, a nonvolatile memory element 101' is formed such that a fixed resistance portion 109 and a nonvolatile memory portion 108 are sequentially stacked on the substrate. To be specific, the nonvolatile memory element 101' includes a second electrode 112 formed on the substrate 120 to form a layer, a fixed resistance layer 115 formed on the second electrode 112 to form a layer, a metal layer 114 formed on the fixed resistance layer 115 to form a layer, a variable resistance layer 113 formed on the metal layer 114 to form a layer, and a first electrode 111 formed on the variable resistance layer 113 to form a layer. The first electrode 111, the variable resistance layer 113, and the metal layer 114 constitute the nonvolatile memory portion 108. The metal layer 114, the fixed resistance layer 115, and the second electrode 112 constitute the fixed resistance portion 109. Although not shown in FIG. 4, for example, the second electrode 112 is connected to the second terminal 104, and the first electrode 111 is connected to the first terminal 103. In such a configuration, the electric pulse output from the electric power supply 105 is applied to the variable resistance layer 113 and the fixed resistance layer 115 via the first electrode 111 and the second electrode 112.

Occurrence of the break down in the nonvolatile memory element 101' (variable resistance layer 113) can be suppressed by setting a resistance value R0 of the fixed resistance layer 115 to be substantially equal to or higher than RL. Therefore, from the experience, it is desired that RL<R0 be satisfied. It is more desired that RL<R0<(RH/5) be satisfied.

The nonvolatile memory element 101 in FIGS. 1 and 2 is unable to achieve an effect of preventing the breakdown by itself, but is able to achieve the effect of preventing the breakdown when combined with the resistor 102 to constitute the nonvolatile memory apparatus 100. On the other hand, the nonvolatile memory element 101' in FIG. 4 is able to achieve the effect of preventing the breakdown by itself.

The resistance value of the variable resistance layer 113 in the nonvolatile memory element 101 or 101' increases or decreases according to a direction in which the voltage is applied. For example, when a pulse voltage larger than a predetermined threshold voltage is applied to the variable resistance layer 113 (between the first electrode 111 and the second electrode 112 in FIG. 2, and between the first electrode 111 and the metal layer 114 in FIG. 4), the resistance value of the variable resistance layer 113 increases or decreases, whereas when a pulse voltage smaller than the threshold voltage is applied to the variable resistance layer 113, the resistance value of the variable resistance layer 113 does not vary.

As materials for the first electrode 111, the second electrode 112, and the metal layer 114, for example, Pt (platinum), W (tungsten), Cu (copper), Al (aluminum), TiN (titanium nitride), TaN (tantalum nitride), or TiAlN (titanium aluminum nitride) may be used. As a method of forming the first electrode 111, the second electrode 112, and the metal layer 114, for example, sputtering may be used. Each of the first electrode 111, the second electrode 112, and the metal layer 114 may have a thickness of 200 nm, for example. The first electrode 111, the second electrode 112, and the metal layer 114 may have an area of, for example, 3 µm².

The variable resistance layer 113 comprises tantalum oxide. As defined herein, the tantalum oxide satisfies 0<x<2.5 when the tantalum oxide is represented by TaOx. The reason why x falls within this range will be described later. Since the variable resistance layer 113 can be formed at a relatively low substrate temperature, it may be formed on, for example, a resin material. The variable resistance layer 113 may have a thickness of, for example, 20 nm.

As a material of the fixed resistance layer 115, for example, Ni—Fe—O may be used. As a method of forming the fixed resistance layer 115, for example, sputtering may be used. The fixed resistance layer 115 may have a thickness of, for example 100 nm. By changing the area or thickness of the fixed resistance layer 115, the resistance value can be controlled. The fixed resistance layer 115 has a resistance value of, for example, 1000Ω. The fixed resistance layer 115 may be manufactured in a semiconductor process using polysilicon as a material. Or, the fixed resistance layer 115 may be formed by a diffusion resistance portion formed within the substrate 120 by doping.

As the substrate 120, a silicon single crystal substrate or a semiconductor substrate may be used, but the substrate 120 is not limited to these substrates.

[Manufacturing Method of Nonvolatile Memory Element]

Subsequently, a manufacturing method of the nonvolatile memory element 101 will be described in detail.

The substrate (semiconductor substrate) 120 with an SiO₂ film formed on the silicon substrate is prepared. A Pt thin film (second electrode 112) having a thickness of 200 nm is formed on the SiO$_2$ film of the substrate 120 by a RF magnetron sputtering process. The electrode has a size of, for example, 3 μm$^2$. The second electrode 112 is formed under the condition in which a degree of vacuum is, for example, 1.0 Pa, an RF power is 250 W, an Ar flow rate is 10 sccm, and a film forming time is 20 minutes.

Next, a tantalum oxide film (variable resistance layer 113) having a thickness of 20 nm is formed on the second substrate 112 by a reactive RF sputtering process using a Ta target. Conditions for the sputtering are shown on table 1.

TABLE 1

| Target | Ta |
|---|---|
| Degree of vacuum (Pa) | 0.2-5 (Pa) |
| Substrate heating temperature (° C.) | 20-400 (° C.) |
| Sputtering gas | Ar + O$_2$ |
| O$_2$ flow rate ratio (%) | 0.1-10 (%) |
| RF-Power (W) | 150-300 (W) |
| Film thickness (nm) | 1-300 (nm) |

Finally, a Pt thin film (first electrode 111) having a thickness of 200 nm is formed on the variable resistance layer 113 by the RF sputtering process. The sputtering is performed under the same condition as that for forming the second electrode 112.

Figure 5:
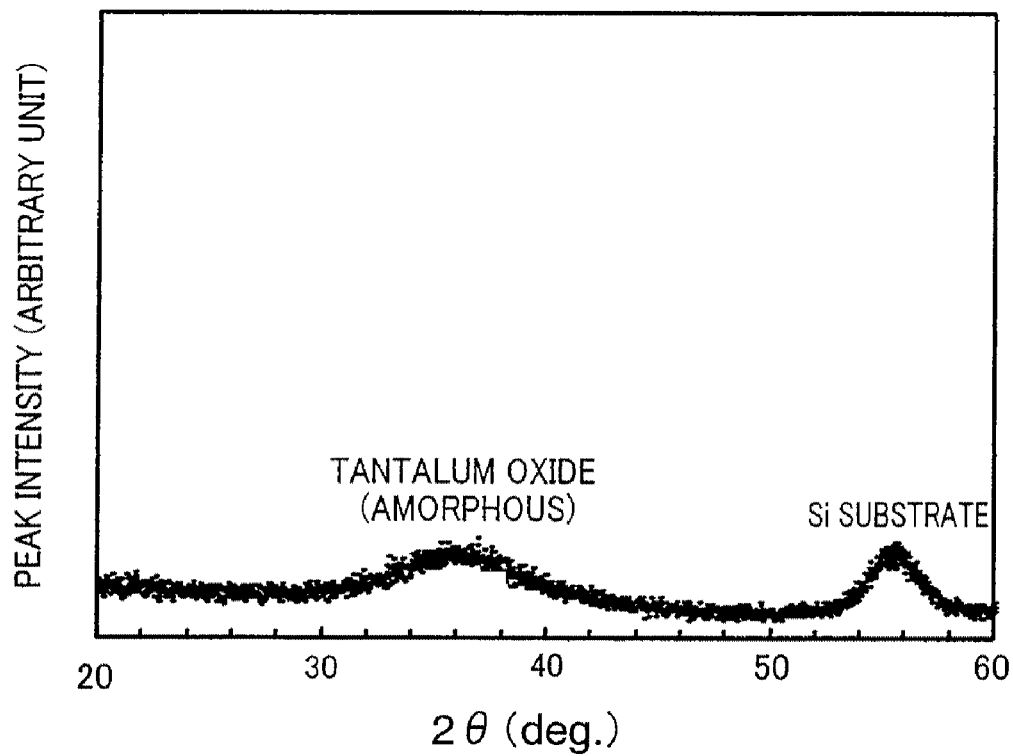
FIG. 5 is a XRD (X-ray diffraction) chart of a variable resistance layer which is made of a tantalum oxide and has a film thickness of 40 nm, which is obtained when a substrate temperature is 30° C., and $O_2$ flow rate ratio is 0.5%.

FIG. 5 is a XRD (X-ray diffraction) chart of a variable resistance layer made of a tantalum oxide having a film thickness of 40 nm, which is obtained when a substrate temperature is 30° C., and O$_2$ flow rate ratio (ratio of a O$_2$ volume flow rate to a volume flow rate of a sputtering gas) is 0.5%. As can be seen from FIG. 5, a peak of metal Ta cannot be confirmed, and therefore, it may be presumed that the tantalum oxide is obtained. In addition, it may be considered that the tantalum oxide has an amorphous state because a broad peak is confirmed in a range where 2θ is 30 to 40 degrees. Note that the peak appearing when 2θ is 56 degrees is attributed to the silicon substrate.

To form the variable resistance layer 113, a sputtering process which does not use a reactive gas such as O$_2$ may be employed by using the tantalum oxide as the target.

[Example of Operation of Nonvolatile Memory Element]

Subsequently, an example of the operation of the nonvolatile memory element 101, i.e., an example of the operation in writing and reading out of data will be described with reference to the drawings.

Figure 6:
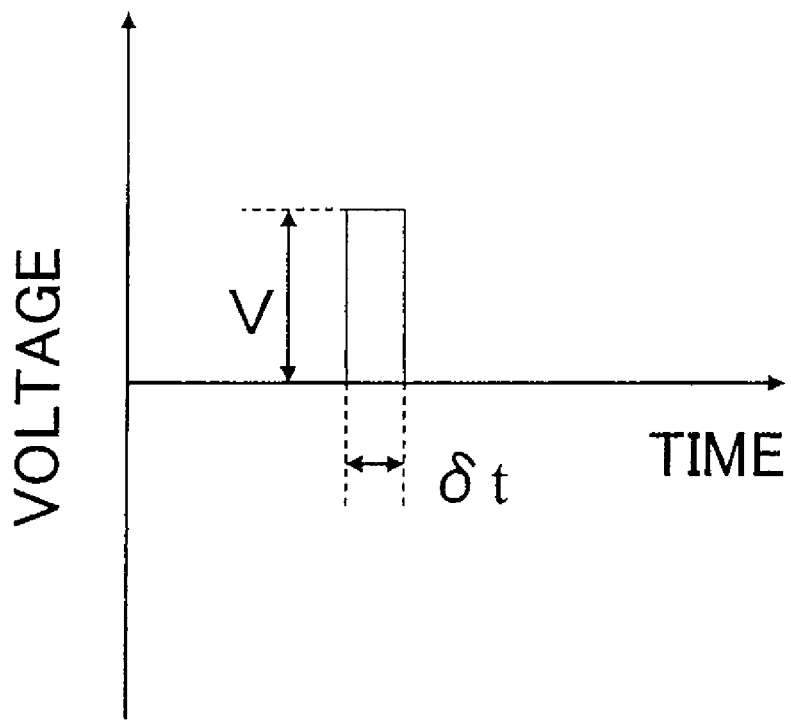
FIG. 6 is a view showing an example of an electric pulse applied between a first electrode and a second electrode in Embodiment 1 of the present invention.

FIG. 6 is a view showing an example of an electric pulse applied between the first electrode and the second electrode in Embodiment 1 of the present invention. In FIG. 6, a rectangular pulse is shown as the example of the electric pulse applied in this embodiment. In FIG. 6, V denotes a voltage of the electric pulse, and δt denotes a pulse width of the electric pulse. δt is, for example 100 nsec, and an absolute value of V falls within a range of 1.2V to 4V. By making a polarity of the electric pulse different, a resistance state of the variable resistance layer 113 can be changed.

Figure 7:
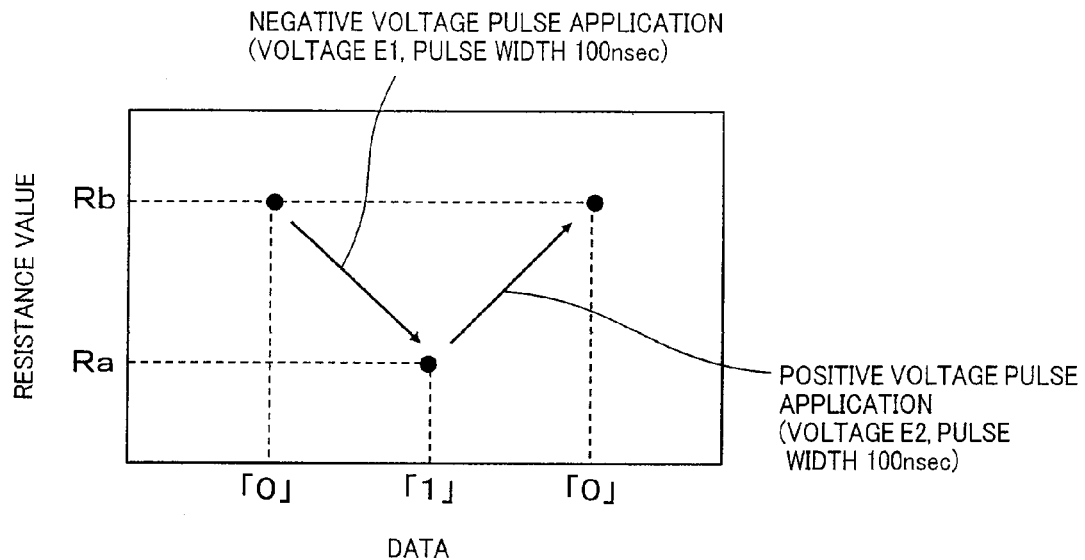
FIG. 7 is a view showing an example of the operation of the nonvolatile memory element according to Embodiment 1 of the present invention, which occurs when writing data.

FIG. 7 is a view showing an example of the operation of the nonvolatile memory element 101 occurring when writing data.

When two kinds of electric pulses having different polarities and a pulse width of 100 nsec are applied alternately between the second electrode 112 and the first electrode 111, the resistance value of the variable resistance layer 113 varies as shown in FIG. 7. To be specific, when a negative voltage pulse (voltage E1, pulse width 100 nsec) is applied between the electrodes, the resistance value of the variable resistance layer 113 decreases from a high-resistance value Rb (8.5× 10$^2$Ω) to a low-resistance value Ra (1.5×10$^2$Ω). On the other hand, when a positive voltage pulse (voltage E2, pulse width 100 nsec) is applied between the electrodes, the resistance value of the variable resistance layer 113 increases from the low-resistance value Ra to the high-resistance value Rb. Whereas an example in which the voltage E1 is −3.5V and the voltage E2 is +2.5V is illustrated herein, the polarities and absolute values of the voltages may be different from those in this example. The voltages are defined by the electric potential of the first electrode based on the second electrode.

In the example shown in FIG. 7, the high-resistance value Rb is allocated to data "0" and the low-resistance value Ra is allocated to data "1." Therefore, the data "0" is written by applying the positive voltage pulse between the electrodes so that the resistance value of the variable resistance layer 113 becomes the high-resistance value Rb, while the data "1" is written by applying the negative voltage pulse between the electrodes so that the resistance value becomes the low-resistance value Ra.

Figure 8:
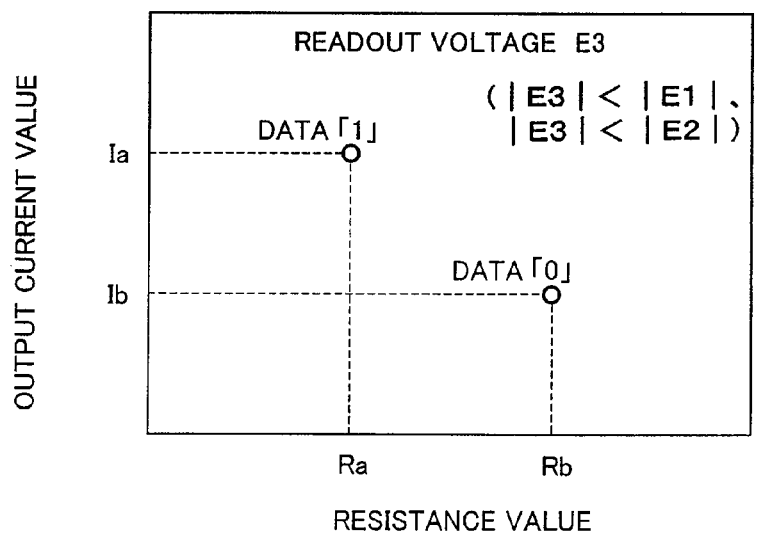
FIG. 8 is a view showing an example of the operation of the nonvolatile memory element according to Embodiment 1 of the present invention, which occurs when reading out data.

FIG. 8 is a view showing an example of the operation of the nonvolatile memory element occurring when reading-out data according to Embodiment 1 of the present invention.

When reading out data, a read-out voltage E3 (|E3|≦|E1|, |E3|<|E2|) which has an amplitude smaller than that of the electric pulse applied to vary the resistance value of the variable resistance value 113 is applied between the electrodes. As a result, a current corresponding to the resistance value of the variable resistance layer 113 is output, and its output current value is detected, thereby enabling reading out of the written data.

In the example illustrated in FIG. 8, since an output current value Ia corresponds to the resistance value Ra and an output current value Ib corresponds to the resistance value Rb, the data "1" is read out when the output current value 1a is detected, while the data "0" is read out when the output current value 1b is detected.

Since the variable resistance layer 113 serves as a memory portion in a region sandwiched between the second electrode 112 and the first electrode 111 in the manner described above, the nonvolatile memory element 101 operates as a memory.

[Current-Voltage Characteristic of Nonvolatile Memory Element]

Subsequently, a current-voltage characteristic of the nonvolatile memory element 101 will be described by comparing the characteristic with that of Comparative example.

Figure 9:
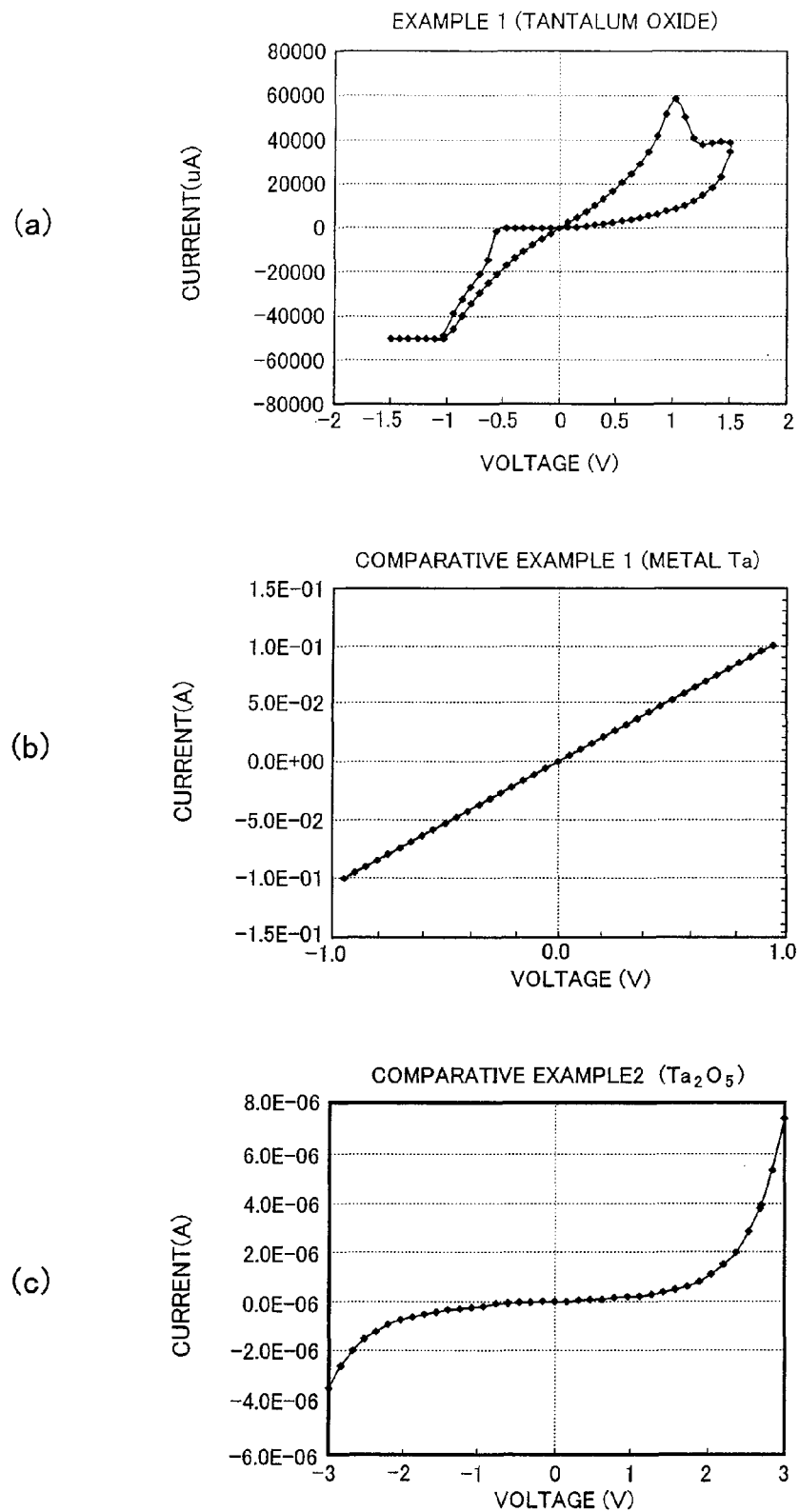

FIG. 9 is a view showing an electric characteristic of the nonvolatile memory element. FIG. 9(a) is a view showing a current-voltage characteristic of the nonvolatile memory element according to Embodiment 1 of the present invention. FIGS. 9(b) and 9(c) are views showing current-voltage characteristics of nonvolatile memory elements according to Comparative example 1 and Comparative example 2, respectively.

As used herein, Comparative example 1 is an element having a structure in which metal Ta is sandwiched between the first electrode and the second electrode, and Comparative example 2 is an element having a structure in which Ta$_2$O$_5$ resulting from oxidation of Ta is sandwiched between the first electrode and the second electrode.

As shown in FIG. 9(a), in the nonvolatile memory element 101, the current-voltage characteristic shows a hysteresis characteristic. On the other hand, as shown in FIGS. 9(b) and 9(c), in each of the elements according to Comparative example 1 and Comparative example 2, the current-voltage characteristic does not show the hysteresis characteristic.

From the above, it can be confirmed that the nonvolatile memory element 101 serves as a resistance variable nonvolatile memory element by using the variable resistance layer 113.

A resistance varying phenomenon was not confirmed although the electric pulse was actually applied to Comparative example 1 and Comparative example 2. For this reason, Comparative example 1 and Comparative example 2 cannot be used as the resistance variable nonvolatile memory element having a reversible rewrite characteristic.

[Composition of Variable Resistance Layer]

Subsequently, a composition of the variable resistance layer 113 comprising the tantalum oxide will be described.

Figure 10:
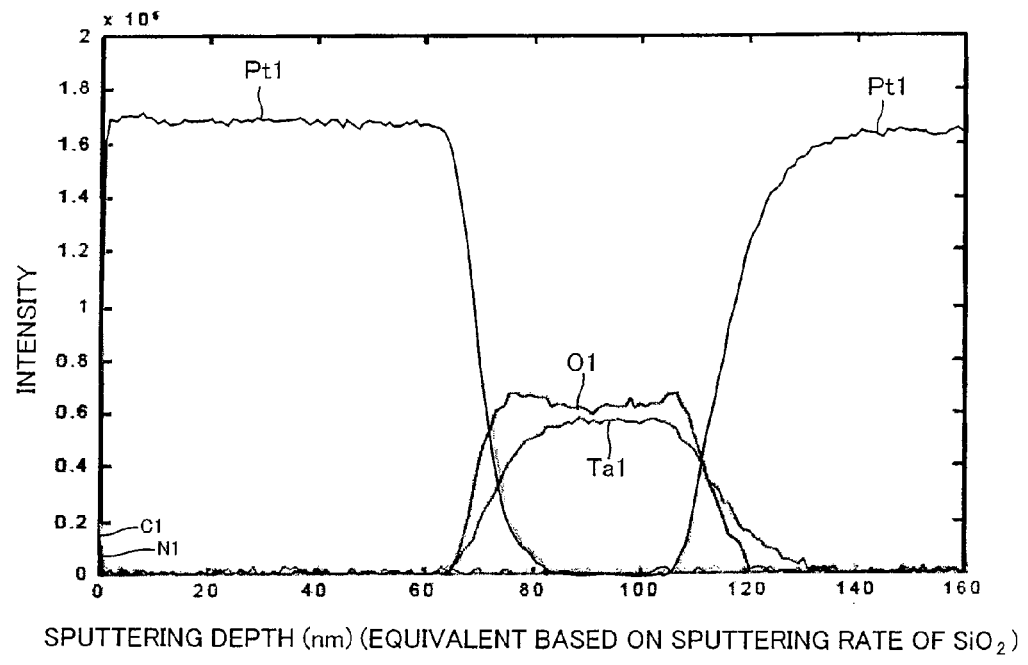
Figure 10:
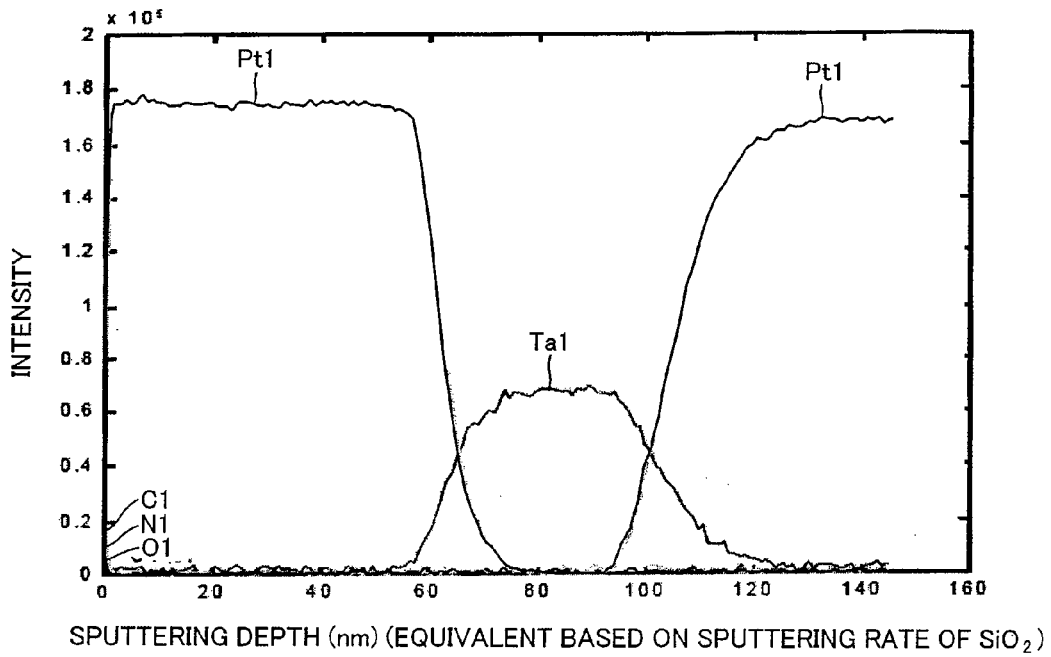

FIG. 10 is a view showing results of Auger analysis. FIG. 10(a) is a view showing a result of the Auger analysis in a depth direction of a sample which is the variable resistance layer included in the nonvolatile memory element according to Embodiment 1 of the present invention and shows the resistance varying phenomenon as described above. FIG. 10(b) is a view showing a result of the Auger analysis in a depth direction of sample metal Ta which does not show the resistance varying phenomenon as described above.

The sample metal Ta is identical to that in Comparative example 1 described above and has a thickness of 20 nm. A first Pt electrode having a thickness of 50 nm is formed on the sample metal Ta.

As should be clearly understood from comparison between FIGS. 10(a) and 10(b), only in the sample showing the resistance varying phenomenon, tantalum have been oxidized. A result of analysis of an atom ratio between Ta and O in the sample which is the variable resistance layer included in the nonvolatile memory element according to Embodiment 1 of the present invention was O/Ta=0.5/1.

In accordance with the resistance varying characteristic of the nonvolatile memory element of this embodiment, the current-voltage characteristic of the nonvolatile memory element, and the composition of the variable resistance layer in the nonvolatile memory element, it may be considered to be essential that tantalum have been oxidized to a certain extent, to show a desired resistance varying phenomenon. With regard to its range, it is considered that O/Ta=0.5/1, i.e., at least $0 < x < 2.5$ is necessary when the tantalum oxide is represented by TaOx. In particular, a desired characteristic may be confirmed when a composition ratio is approximately O/Ta=0.5/1 shown in this embodiment.

Furthermore, more accurate composition analysis was conducted by a RBS (Rutherford Back Scattering) method. As a result, a composition of the sample of "O/Ta=0.5/1" atom ratio in the Auger analysis was O/Ta=1.4/1. Note that the composition analysis according to the RBS method relates to an average composition of the entire film. Some documents (for example, Journal of Vacuum Science A, Volume 21, No. 3, (2003) P 616-622, Pei-Chuen Jiang and J. S. Chen) report that the result of the Auger analysis is different from the result of the RBS analysis as described above. According to this document, it is required that a sensitivity coefficient be compensated for each material in the Auger analysis, and the RBS analysis generally provides higher reliability than the Auger analysis.

The result of the RBS analysis corresponds to a composition of a center region in a film thickness direction of the tantalum oxide in the result of the Auger analysis in FIG. 10(a). As can be seen from FIG. 10(a), an oxygen content rate increases in the vicinity of both interfaces (interfaces with respect to the Pt layer) of the tantalum oxide. Therefore, there is a possibility that the oxygen content rate in the interface regions is higher than the composition analyzed by the RBS method.

Figure 11:
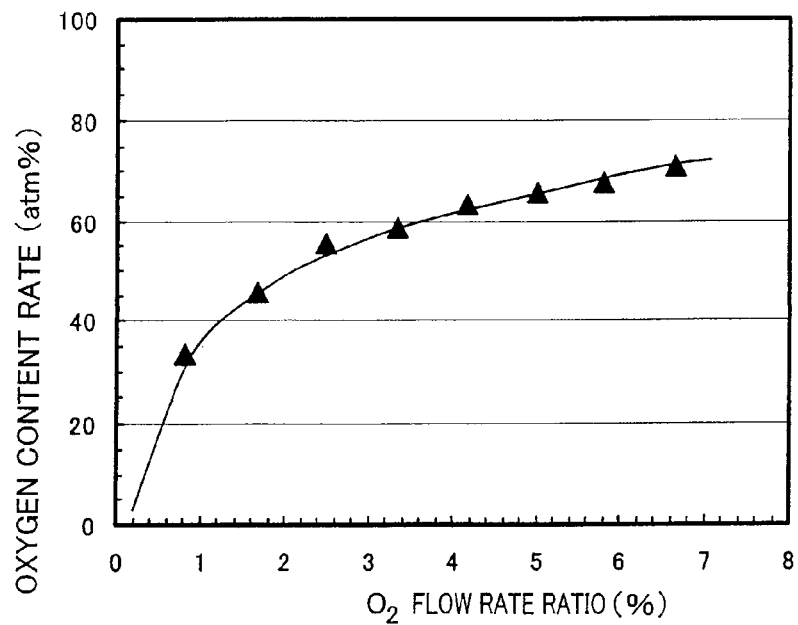
FIG. 11 is a view showing a relationship between an oxygen content rate and an $O_2$ flow rate ratio of a film forming gas of the variable resistance layer included in the nonvolatile memory element according to Embodiment 1 of the present invention.

FIG. 11 is a view showing a relationship between the $O_2$ flow rate ratio of the sputtering gas and the oxygen content rate (atom ratio) of the tantalum oxide layer which is the variable resistance layer which is analyzed by the RBS method. It is confirmed that the oxygen content rate tends to be saturated when the $O_2$ flow rate ratio is 7% or higher. Nonetheless, it can be seen that the composition of the tantalum oxide layer can be controlled continuously based on the $O_2$ flow rate ratio. That is, when the tantalum oxide layer is formed by the reactive RF sputtering process, the oxygen content rate of the tantalum oxide layer can be controlled to have a desired constant value in the thickness direction of the tantalum oxide layer by controlling the $O_2$ flow rate ratio of the sputtering gas.

In accordance with the resistance varying characteristic of the nonvolatile memory element of the this embodiment, the current-voltage characteristic of the nonvolatile memory element, and the composition of the variable resistance layer in the nonvolatile memory element, it may be considered to be essential that tantalum have been oxidized to a certain extent, to show a desired resistance varying phenomenon.

[Relationship between $O_2$ Flow Rate Ratio and Resistance Rate]

Subsequently, a relationship between the $O_2$ flow rate ratio and the resistance rate in the manufacturing process of the variable resistance layer 113 of the nonvolatile memory element 101 will be described.

Figure 12:
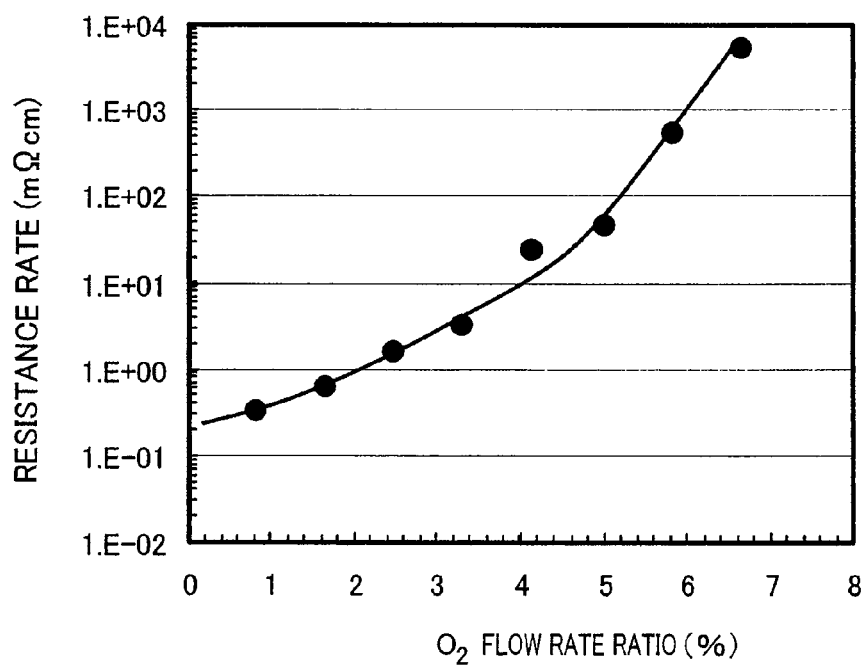
FIG. 12 is a view showing a relationship between the $O_2$ flow rate ratio and a resistance rate of the variable resistance layer included in the nonvolatile memory element according to Embodiment 1 of the present invention.

FIG. 12 is a view showing a relationship between the $O_2$ flow rate ratio and resistance rate of the variable resistance layer included in the nonvolatile memory element according to Embodiment 1 of the present invention. The resistance rate described here is calculated based on a sheet resistance value by a four-terminal method. In FIG. 12, each plot corresponds to the associated plot in FIG. 11. In FIGS. 11 and 12, the plots whose $O_2$ flow rate ratios are equal show the results obtained from the same experiment.

As can be seen from FIG. 12, the resistance rate of the variable resistance layer 113 changes continuously according to the value of the $O_2$ flow rate ratio. Therefore, it may be considered that the resistance rate of the variable resistance layer 113 can be controlled continuously based on the oxygen content rate of the variable resistance layer 113. From this, it may be considered that the oxygen content rate of the variable resistance layer 113 must fall within an appropriate range to obtain a desired resistance varying phenomenon in the variable resistance layer 113.

Figure 13:
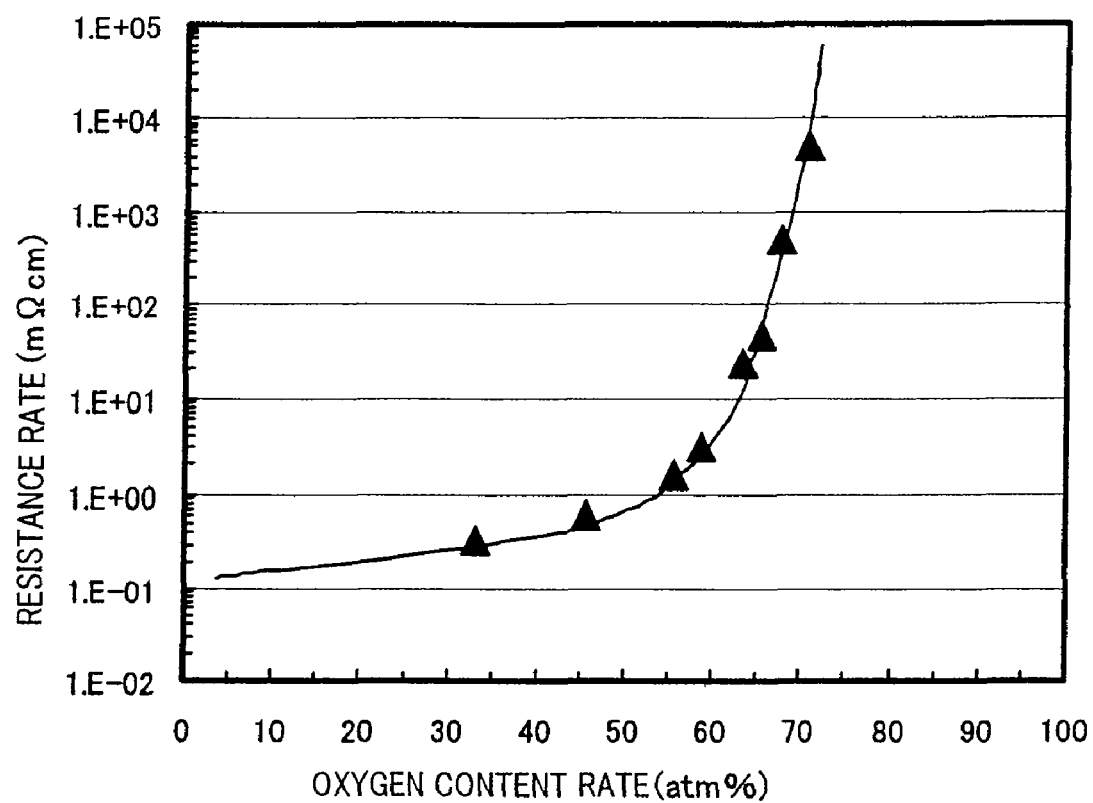
FIG. 13 is a view showing a relationship between the oxygen content rate and the resistance rate of the variable resistance layer included in the nonvolatile memory element according to Embodiment 1 of the present invention.

The inventors measured resistance rates of samples having oxygen content rates shown in FIG. 13 and found a regression curve of measurement data. FIG. 13 shows the measurement data (indicated by black triangles) and a regression curve thereof. In FIG. 13, each plot corresponds to the associated plot in FIGS. 11 and 12. In FIGS. 11 and 13, the plots whose oxygen content rates are equal show the result obtained from the same experiment. In FIGS. 12 and 13, the plots whose resistance rates are equal show the result obtained from the same experiment. Also, the inventors confirmed that the samples having the oxygen content rates exhibit the resistance varying characteristic by applying the electric pulses to the samples. According to the regression curve, it may be presumably recognized that the variable resistance layer is turned to be capable of serving as an electric conductor (a substance having a resistance rate defined as the electric conductor) and exhibits the resistance varying phenomenon confirmed in each sample when x satisfies 0<x<2.5 in the case where the variable resistance layer is represented by TaOx.

Figure 14:
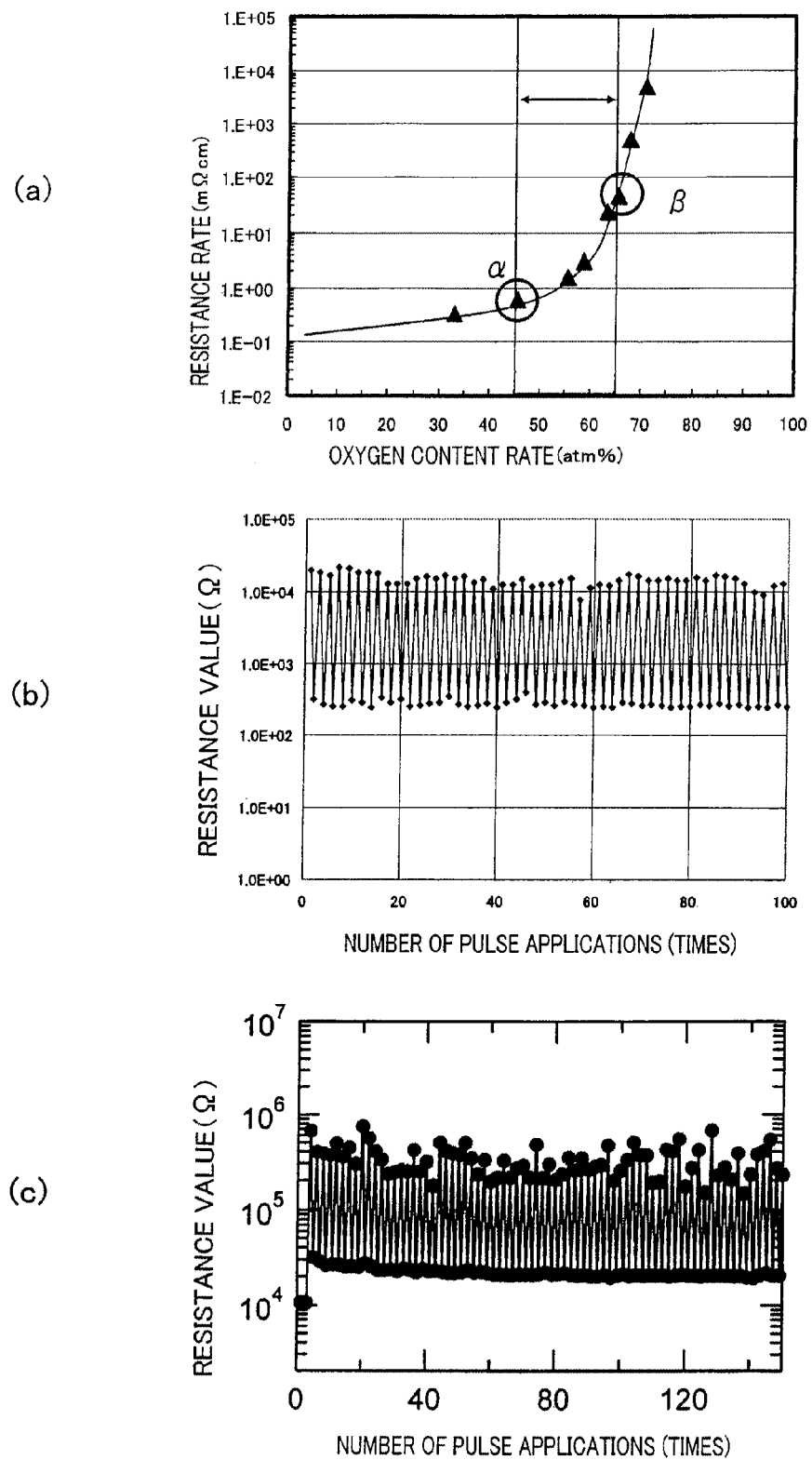
FIG. 14 is a view showing a relationship between the oxygen content rate and a resistance varying characteristic of the variable resistance layer included in the nonvolatile memory element according to Embodiment 1 of the present invention.

FIG. 14 is a view showing a resistance varying characteristic in a composition range in which the oxygen content rate of the variable resistance layer is 45 to 65 atm %. FIG. 14(a) is a view showing a relationship between the oxygen content rate and the resistance rate. FIG. 14(b) is a view showing a relationship between the number of pulse applications and the resistance value in the case where the oxygen content rate is 45 atm %. FIG. 14(c) is a view showing a relationship between the number of pulse applications and the resistance value in the case where the oxygen content rate is 65 atm %.

According to the measurement of the resistance varying characteristic, in a range of the oxygen content rate from α point (oxygen content rate: 45 atm %) to β point (oxygen content rate: 65 atm %) shown in FIG. 14(a), a high-resistance value was desirably not less than five times as high as a low-resistance value. FIG. 14(b) and FIG. 14(c) show a resistance varying characteristic of the sample having the oxygen content rate at the α point (oxygen content rate: 45 atm %) with respect to the number of pulse applications and show a resistance varying characteristic of the sample having the oxygen content rate at the β point (oxygen content rate: 65 atm %) with respect to the number of pulse applications, respectively. As can be seen from FIGS. 14(b) and 14(c), in both of the oxygen content at the α point and the oxygen content at the β point, the high-resistance value is desirably not less than five times as high as the low-resistance value. From this measurement result, a desired resistance varying phenomenon is presumably recognized in a range of 0<x≦1.9 in the case where the variable resistance layer is represented by TaOx. In addition, since the high-resistance value was desirably not less than five times as high as the low-resistance value in the range of the oxygen content rate from the α point (oxygen content rate: 45 atm %) to the β point (oxygen content rate: 65 atm %), this composition range may be regarded as an appropriate composition range which enables the memory element to stably operate. Therefore, the composition range in which the oxygen content rate is 45 to 65 atm %, i.e., the range of x, 0.8≦x≦1.9 in the case where the variable resistance layer is represented by TaOx is a more appropriate range of the variable resistance layer (oxygen content rate=45 atm % corresponds to x=0.8, and the oxygen content rate=65 atm % corresponds to x=1.9). In the composition analysis according to the RBS method, the analysis value of the oxygen content has precision of about ±5 atm %. Therefore, the composition range of x contains a measurement error associated with this precision, and in actuality, there may be a possibility that the composition range in which the oxygen content rate is 40 to 70 atm % is this appropriate composition range. Even in the variable resistance layer outside the composition range, the resistance varying phenomenon is confirmed or presumably recognized. However, as compared to the resistance varying phenomenon of the variable resistance layer within this composition range, the resistance rate is smaller or larger, and therefore the high-resistance value is considered to be less than five times as large as the low-resistance value. Therefore, it seems that the variable resistance layer outside the composition range makes it relatively difficult that the memory element stably operates.

[Scalability]

Figure 15:
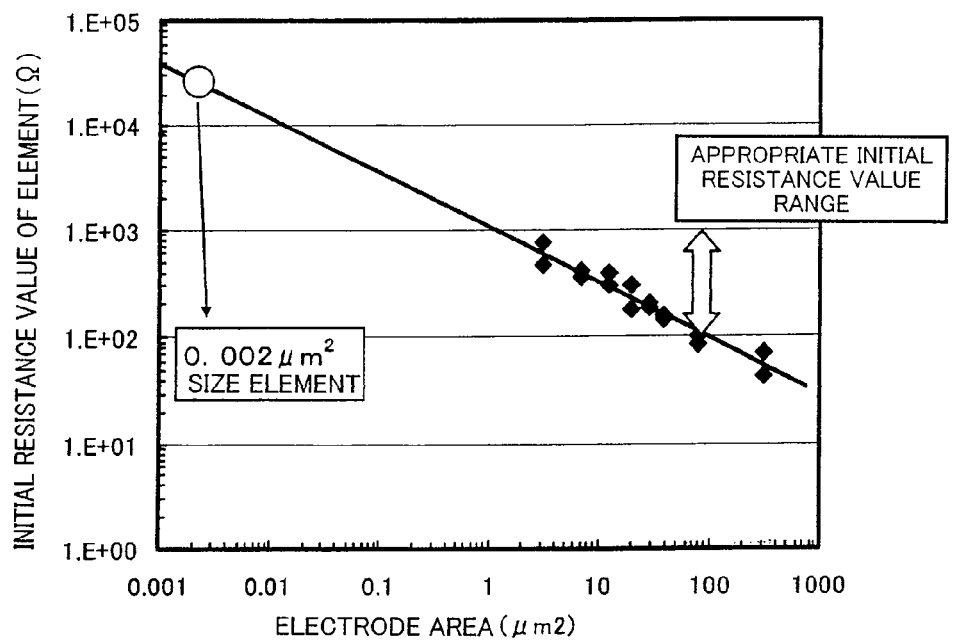
FIG. 15 is a view showing a relationship between an electrode area and an initial resistance value of the nonvolatile memory element according to Embodiment 1 of the present invention.

FIG. 15 shows a relationship between an electrode area and an initial resistance value of the element in a variable resistance layer having a resistance rate of, for example, 6 mΩcm. As can be seen from FIG. 15, the resistance value increases as the element area decreases. The resistance varying phenomenon was confirmed in a range in which the initial resistance value of the element is 100 to 1000Ω as shown in FIG. 15. When using the variable resistance films having an equal resistance rate, the initial resistance value increases as the element area is made smaller, so that a desired resistance varying phenomenon is not recognized. On the other hand, if the element area is larger, the initial resistance value is lower, and therefore, it is difficult to apply a sufficient voltage to the element. As should be understood from above, it is considered that the initial resistance value of the element has an appropriate range. It is necessary to increase the element area to attain an appropriate initial resistance value in a composition having an oxygen content rate higher than that at β point in FIG. 14. However, increasing the area of the memory element will raise problems associated with cost and voltage application. Therefore, an upper limit is actually set in the oxygen content rate of the variable resistance layer.

On the other hand, in a composition having an oxygen content rate lower than that at α point in FIG. 14, the initial resistance value of the element is expected to fall within a appropriate range if the electrode area is made very smaller. In the future, the site of the memory element is expected to be miniaturized up to an electrode area of 0.002 μm². The initial resistance value of the element having the electrode area of 0.002 μm² is presumed to be 3×10⁴Ω based on an experiment value (actually measured value) of FIG. 15. This value is about 30 times higher than the upper limit value of the appropriate initial resistance value. It is therefore required that the resistance rate be approximately 0.2 mΩcm which is obtained by lowering, 6 mΩcm of the resistance rate in the present case about ⅓₀ times, in order to attain the appropriate initial resistance value. As can be seen from FIG. 13, the oxygen content rate of the variable resistance layer having such a resistance rate is about 33 atm % (oxygen content rate at a measurement point of a minimum oxygen content rate of FIG. 13), that is, x=0.5 when the variable resistance layer is represented by TaOx. From the above, in view of the miniaturization of the nonvolatile memory element of the present invention in the future, it may be considered that the appropriate composition range of the TaOx forming the variable resistance layer is 0.5≦x≦1.9.

[Relationship between a Width of an Electric Pulse Applied and a Resistance Value]

Subsequently, a relationship between a width of electric pulses applied between electrodes and a resistance value of the variable resistance layer 113 in the nonvolatile memory element 101 will be described.

Figure 16:
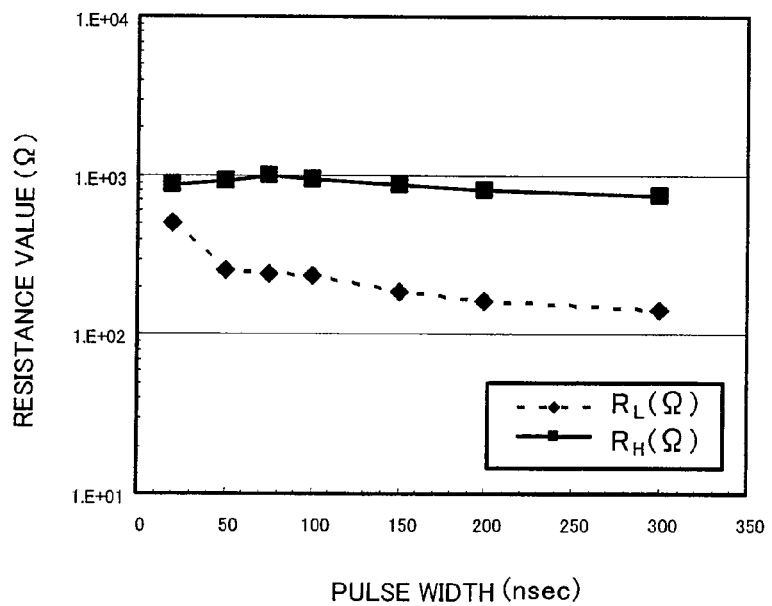
FIG. 16 is a view showing a relationship between a width of electric pulses applied between electrodes and a resistance value of a variable resistance layer in a case where the nonvolatile memory element according to Embodiment 1 of the present invention operates.

FIG. 16 is a view showing the relationship between the width of the electric pulses applied between electrodes and the resistance value of the variable resistance layer in a case where the nonvolatile memory element according to Embodiment 1 of the present invention operates. In FIG. 16, RH denotes a high-resistance value and RL denotes a low-resistance value. Note that each of RH and RL is an average value of the resistance values of the variable resistance layer 113 which are obtained when an electric pulse of each pulse width is applied 100 times.

As shown in FIG. 16, even when the electric pulse applied is a high-speed pulse whose pulse width is for example, 20 nsec, the resistance varying phenomenon can be confirmed. The value of RH is substantially constant in a range from 20 nsec to 300 nsec. The value of RL tends to be higher when the pulse width is 20 nsec but is substantially constant in a pulse width which is not smaller than 50 nsec.

[Variations in Resistance Value of Nonvolatile Memory Element and its Imprinting Characteristic]

Subsequently, description will be given of variations in the resistance value of the nonvolatile memory element 101 and its imprinting characteristic in a case where unipolar electric pulses are applied continuously between the electrodes.

Figure 17:
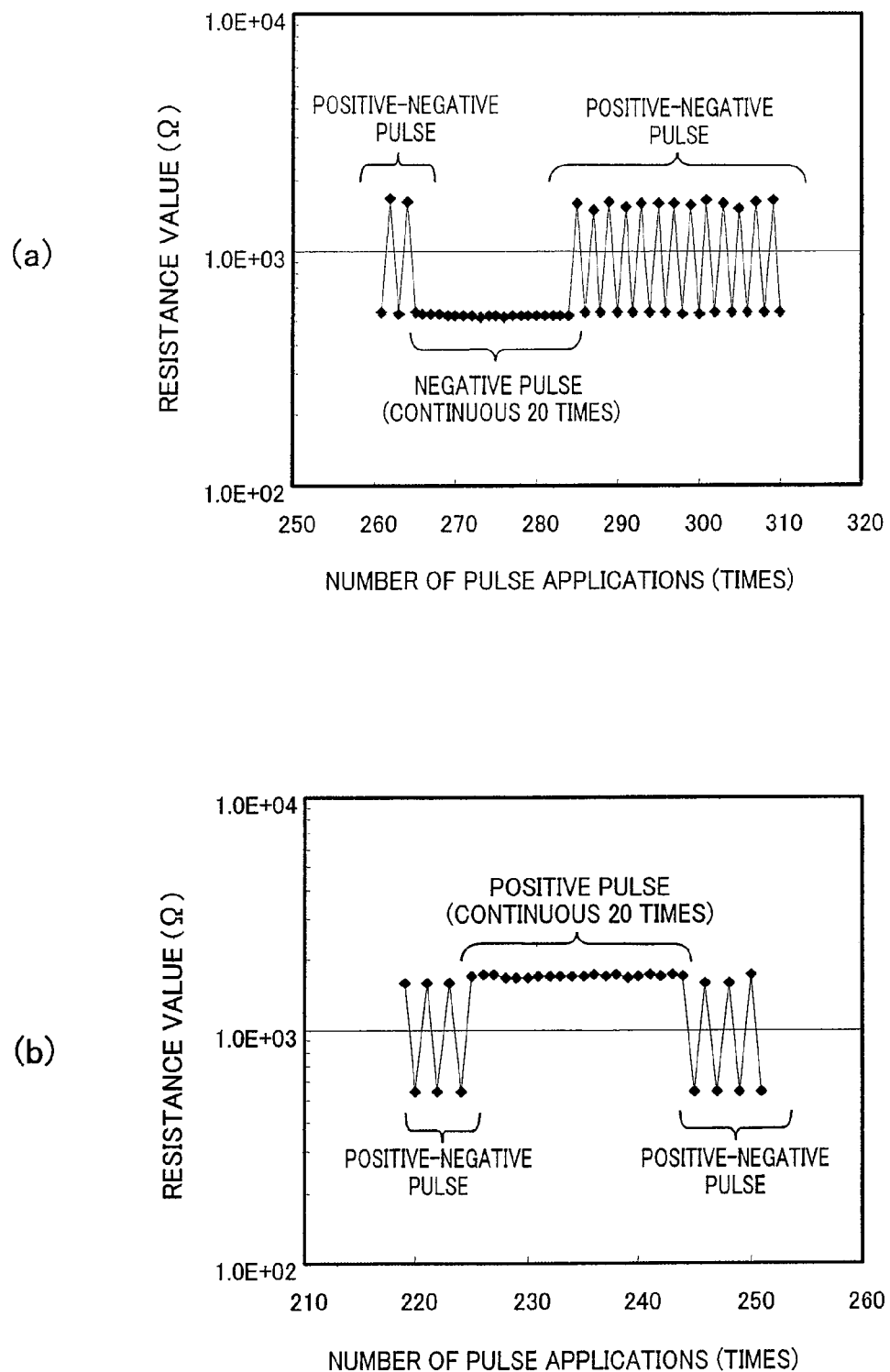
FIG. 17 is a view showing a resistance varying characteristic of the variable resistance layer in a case where electric pulses are applied continuously between the electrodes in the nonvolatile memory element according to Embodiment 1 of the present invention, wherein FIG. 17(*a*) is a view showing a resistance varying characteristic of the variable resistance layer in a case where negative electric pulses are applied, and FIG. 17(*b*) is a view showing a resistance varying characteristic of the variable resistance layer in a case where positive electric pulses are applied.

FIG. 17 is a view showing a resistance varying characteristic of the variable resistance layer in the case where the electric pulses are applied continuously between the electrodes in the nonvolatile memory element according to Embodiment 1 of the present invention, wherein FIG. 17(a) is a view showing a resistance varying characteristic of the variable resistance layer in a case where negative electric pulses are applied, and FIG. 17(b) is a view showing a resistance varying characteristic of the variable resistance layer in a case where positive electric pulses are applied.

When the nonvolatile memory element 101 is in the low-resistance state, negative unipolar electric pulses (low-resistance state attaining pulse) are applied between the first electrode 111 and the second electrode 112 continuously 20 times, generating the low-resistance state continuously. When the nonvolatile memory element 101 is in the high-resistance state, positive unipolar electric pulses (high-resistance state attaining pulse) are applied continuously between the first electrode 111 and the second electrode 112 continuously 20 times, generating the high-resistance state continuously.

As shown in FIG. 17(a), even though the negative electric pulses are applied continuously 20 times to the nonvolatile memory element in the low-resistance state, its resistance value does not substantially vary. By applying the positive electric pulses thereafter, the nonvolatile memory element smoothly changes to the high-resistance state. Thereafter, by applying positive and negative electric pulses alternately, the high-resistance state and the low-resistance state are repeated stably.

As shown in FIG. 17(b), even though the positive electric pulses are applied continuously 20 times to the nonvolatile memory element in the high-resistance state, its resistance value does not substantially vary. By applying the negative electric pulses thereafter, the nonvolatile memory element smoothly changes to the low-resistance state. Thereafter, by applying positive and negative electric pulses alternately, the high-resistance state and the low-resistance state are repeated stably.

From the above results, the nonvolatile memory element 101 does not vary the resistance value even through only either the high-resistance state attaining pulse or the low-resistance state attaining pulse are applied continuously. Therefore, it is not necessary to read out the resistance state in advance, and so-called overwrite becomes possible. In addition, so-called imprinting resistance of the nonvolatile memory element 101 is high, and therefore the element 101 is expected to stably operate.

[Retention Characteristic of Nonvolatile Memory Element]

Subsequently, a retention characteristic of the nonvolatile memory element according to this embodiment will be described.

For the nonvolatile memory element according to Embodiment 1 of the present invention, variations in the resistance value were measured under environments of 210° C. and 180° C. When the element was set in the low-resistance state, the resistance value did not substantially vary as compared to the initial resistance value, while when the element was set in the high-resistance value, the resistance value varied as compared to the initial resistance value. From this, it can be understood that the retention characteristic of the nonvolatile memory element according to Embodiment 1 of the present invention is determined by how the resistance value of the high-resistance state varies. 200 hours was required in the case of 210° C. and 1000 hours or longer was required in the case of 180° C. to reach the resistance values which are the middle of the high-resistance value and the low-resistance value in the initial state.

Figure 18:
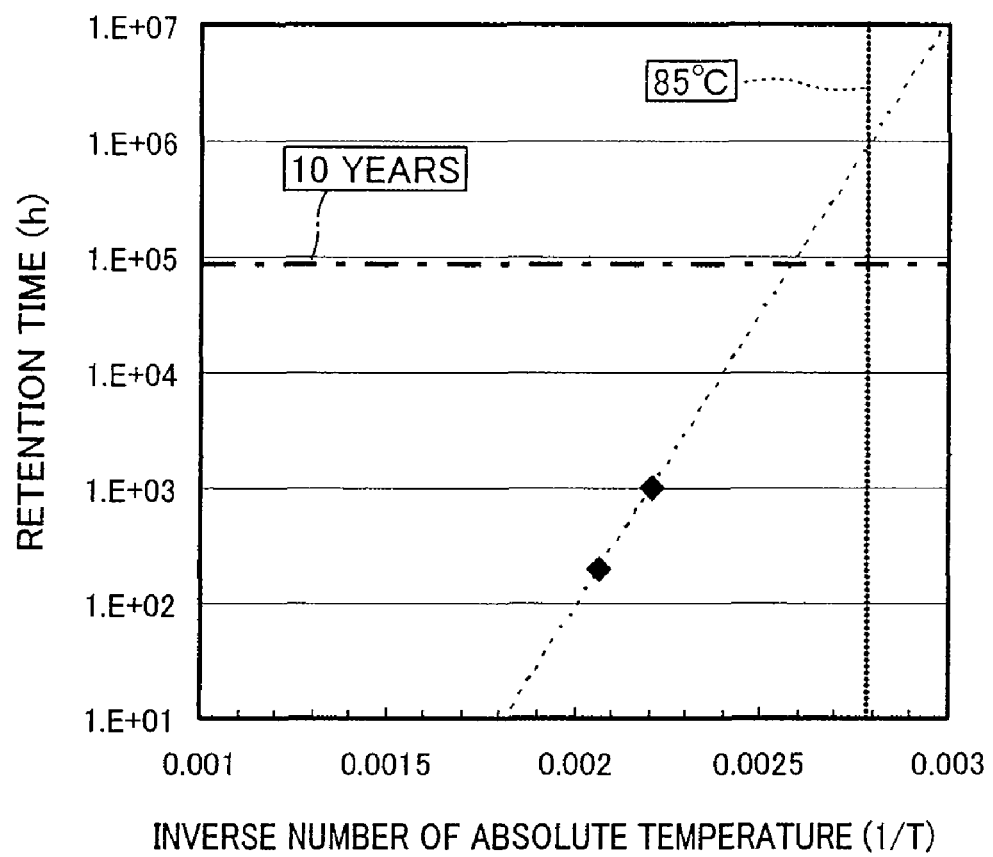
FIG. 18 is view showing Arrhenius plots of the nonvolatile memory element according to Embodiment 1 of the present invention.

FIG. 18 is view showing Arrhenius plots of the nonvolatile memory element according to Embodiment 1 of the present invention. As shown in FIG. 18, under environment of 85° C. or lower, the retention time is pressured to be 10 years or longer. From this, it is considered that the nonvolatile memory element of this embodiment has a very high retention characteristic.

[Modification]

In this embodiment, as shown in FIG. 1, the variable resistance layer 113 is sandwiched between the second electrode 112 located below and the first electrode 111 located above, and both ends portions of the variable resistance layer 113 conform to both end portions of the first electrode 111 in a cross-sectional view. This is merely exemplary and the present invention is not limited to such a configuration.

Figure 19:
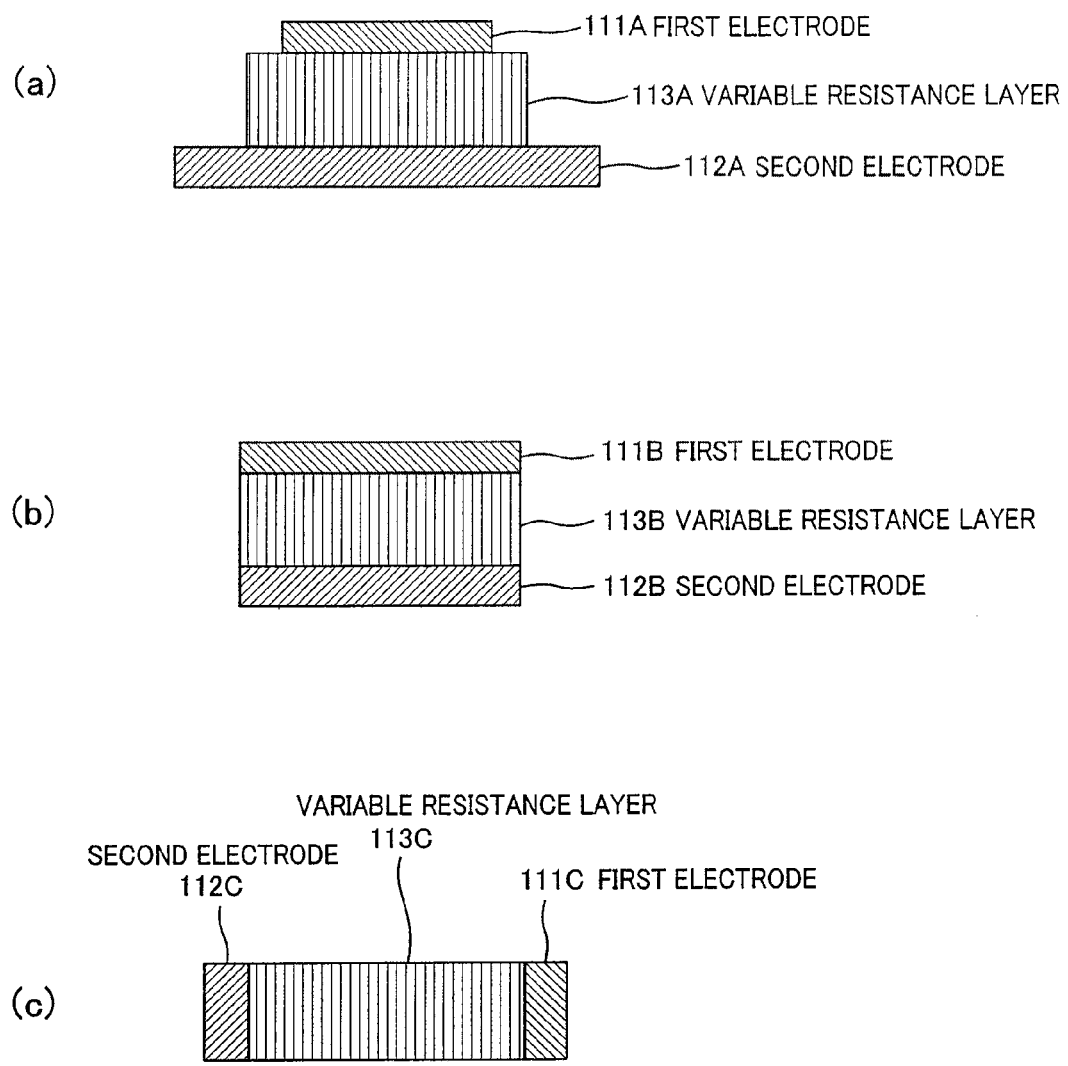
FIG. 19 is a cross-sectional view showing a configuration of Modification of the nonvolatile memory element according to Embodiment 1 of the present invention.

FIGS. 19(a) to 19(c) are cross-sectional views showing a configuration of Modification of the nonvolatile memory element according to Embodiment 1 of the present invention. In FIGS. 19(a) to 19(c), the substrate and the oxide layer are omitted for the sake of convenience.

In Modification shown in FIG. 19(a), a second electrode 112A, a variable resistance layer 113A, and a first electrode 111A are stacked in this order, and both end portions of the second electrode 112A, the variable resistance layer 113A, and the first electrode 111A do not conform to each other in a cross-sectional view. On the other hand, in Modification shown in FIG. 19(b), a second electrode 112B, a variable resistance layer 113B, and a first electrode 111B are stacked in this order, and both end portions of the second electrode 112B, the variable resistance layer 113B, and the first electrode 111B conform to each other in a cross-sectional view. The nonvolatile memory element of the present invention may be configured in this way.

Whereas in the nonvolatile memory element 101 and the above two modifications, the variable resistance layer is sandwiched between electrodes located above and below, electrodes may be formed on both end surfaces of the variable resistance layer to flow a current in a direction parallel to a main surface of the variable resistance layer. To be specific, as shown in FIG. 19(c), a first electrode 111C may be formed on one end surface of a variable resistance layer 113C and a second electrode 112C may be formed on the other end surface thereof so that a current flows in a direction parallel to a main surface of the variable resistance layer 113C.

Although not shown, the nonvolatile memory element according to this embodiment includes an insulating layer. As the insulating layer, a fluorine-doped oxide film may be formed by a CVD process or the like. Alternatively, the insulating layer may be omitted Likewise, although not shown, the nonvolatile memory element according to this embodiment includes a wire layer. As a wire material, for example, Al, W, or Cu may be used. Alternatively, the wire layer may be omitted.

Comparative Example

As Comparative example, the nonvolatile memory element shown in FIG. 2 was manufactured, and electric pulses were applied to the nonvolatile memory element to which a resistor was not connected. In this state, its operation was checked. Pt was used for the first electrode and the second electrode. The thickness of the first electrode and the thickness of the second electrode were each set to 200 nm. The size of the first electrode and the size of the second electrode were each set to 3 µm². The thickness of the variable resistance layer was set to 20 nm. The condition for forming the variable resistance layer was shown in table 1. In Comparative example, when the tantalum oxide contained in the variable resistance layer is represented by $TaO_x$, X was 1.2. In Comparative example, the resistor was not connected to the element, and the configuration of the nonvolatile memory apparatus was such that the resistor 102 was excluded from the circuit of FIG. 1.

In Comparative example, the low-resistance state attaining pulse was a rectangular pulse in which a voltage was +2.5V and a pulse width was 100 nsec. The high-resistance state attaining pulse was a rectangular pulse in which a voltage was −3 V and a pulse width was 100 nsec. After applying the low-resistance state attaining pulse or the high-resistance state attaining pulse, a voltage of 50 mV was applied, a current was measured, and a resistance value was calculated.

In Comparative example, the resistance value of the nonvolatile memory element just after being manufactured was about $10^6 \Omega$ which was relatively high. By applying the low-resistance state attaining pulse to this nonvolatile memory element several times, the resistance value was lowered to about 300Ω (hereinafter this operation was referred to as "forming"). After the resistance value was lowered, the low-resistance state and the high-resistance state were repeated by applying high-resistance state attaining pulse and the low-resistance state attaining pulse alternately. The average value (RH) of the resistance values of the high-resistance state was about $10^5 \Omega$, while the average value (RL) of the resistance values of the low-resistance state was about 300Ω.

Figure 20:
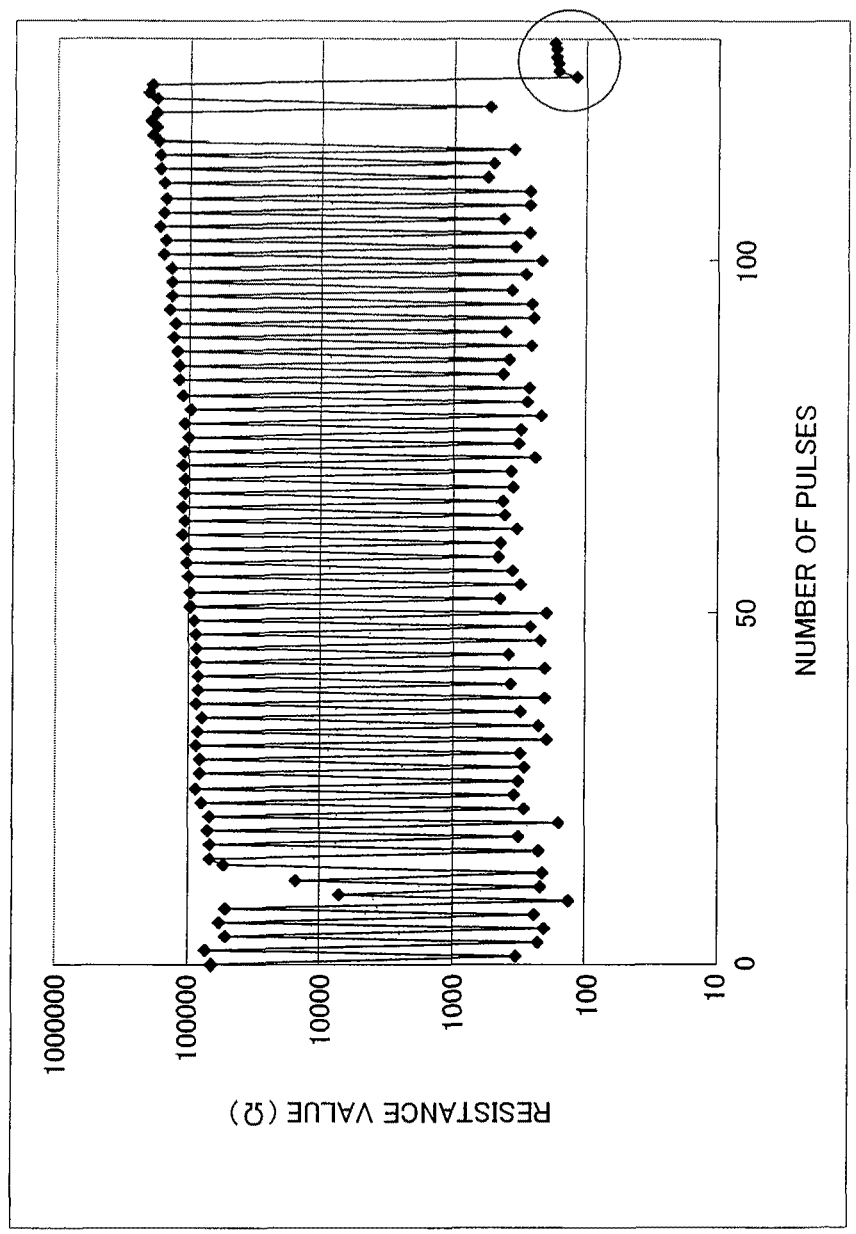
FIG. 20 is a view showing a change in a resistance state occurring when electric pulses are applied to a nonvolatile memory element according to Comparative example.

FIG. 20 is a view showing variations in the resistance state occurring when electric pulses are applied to the nonvolatile memory element according to Comparative example. In FIG. 20, variations in the resistance value after the "forming" are shown.

As shown in FIG. 20, in an initial stage, the nonvolatile memory element of Comparative example stably changed between the high-resistance state and the low-resistance state. However, after repeating writing about 130 times, the resistance value fell to well below RL (fell to about 100Ω) when the low-resistance state attaining pulse was applied, and thereafter, the element did not return to the high-resistance state even though the high-resistance state attaining pulse was applied (portion indicated by a circle in FIG. 20). This implies that the resistance value was irreversibly lowered (break down occurred).

A plurality of nonvolatile memory elements were manufactured and the experiment was repeated in the same manner. It was found that in most of the cases where the resistor was not connected to the elements, the break down occurred after the electric pulses were applied about several hundreds times, and the nonvolatile memory elements which were capable of repeating writing 20000 times or more were obtained in very rare cases.

Example

In Example, the nonvolatile memory apparatus shown in FIGS. 3 and 4 was manufactured, and electric pulses were applied to the nonvolatile memory apparatus. In this state, its operations was confirmed. Pt was used for the first electrode, the second electrode, and the metal layer. The thickness of the first electrode, the thickness of the second electrode, and the thickness of the metal layer were each set to 200 nm. The size of the first electrode, the size of the second electrode, and the size of the metal layer were each set to 3 µm². The thickness of the variable resistance layer was set to 20 nm. The condition for forming the variable resistance layer was shown in table 1 as in Comparative example. In Example, when the tantalum oxide contained in the variable resistance layer is represented by $TaO_x$, X was 1.2. As a material of the fixed resistance layer, Ni—Fe—O was used. The resistance value of the fixed resistance layer was controlled to be about 1000Ω.

In Example, the low-resistance state attaining pulse was a rectangular pulse in which a voltage was +3V and a pulse width was 100 nsec, and the high-resistance state attaining pulse was a rectangular pulse in which a voltage was −3.5V and a pulse width was 100 nsec (considering that the fixed resistance is contained in the nonvolatile memory element in Example, the absolute value of the voltage of the low-resistance state attaining pulse and the absolute value of the voltage of the high-resistance pulse were set larger than those of Comparative example by 0.5V). After applying the low-resistance state attaining pulse or the high-resistance state attaining pulse, a voltage of 50 mV was applied, a current was measured, and a resistance value was calculated.

In Example, a total resistance value of the nonvolatile memory portion and the resistance value of the fixed resistance portion just after being manufactured was about $10^6 \Omega$ which was relatively high. By applying the low-resistance state attaining pulse to the nonvolatile memory portion and the fixed resistance portion several times, the resistance value was lowered to about 1.7 kΩ ("forming"). After the resistance value was lowered, the low-resistance state and the high-resistance state were repeated by applying high-resistance state attaining pulse and the low-resistance state attaining pulse alternately. The average value (RH+resistance value of fixed resistance layer) of the resistance values of the high-resistance state was about 25 kΩ, while the average value (RL+resistance value of fixed resistance layer) of the resistance values of the low-resistance state was about 1.3 kΩ.

Figure 21:
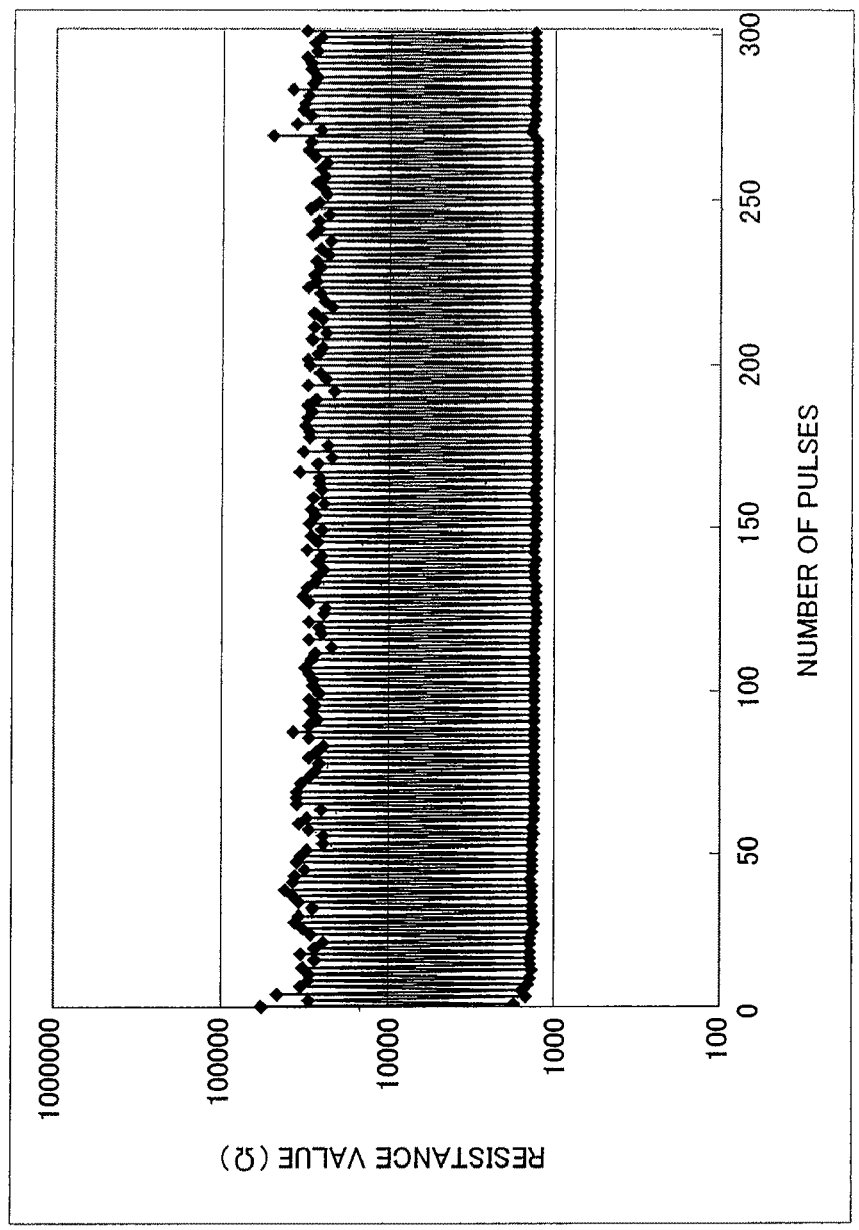
FIG. 21 is a view showing a change in a resistance state occurring when electric pulses are applied to a nonvolatile memory element according to Example.

FIG. 21 is a view showing variations in a resistance state occurring when electric pulses are applied to the nonvolatile memory element according to Example. In FIG. 21, variations in the resistance value after the forming are shown.

As shown in FIG. 21, the nonvolatile memory element of Example stably changed between the high-resistance state and the low-resistance state. Even after repeating writing about 20000 times, the break down was not confirmed, unlike Comparative example.

From the above described results, it was found out that the nonvolatile memory apparatus of Example was able to effectively suppress the break down. In the nonvolatile memory apparatus of Example, when the resistance value of the nonvolatile memory portion is lowered to the resistance value which is substantially equal to the resistance value of the fixed resistance portion by application of the low-resistance state attaining pulse, an normegligible voltage resulting from division based on a voltage-division relationship is applied to the fixed resistance portion. It was presumed that the resulting voltage applied to the nonvolatile memory portion (or the current flowing in the element) is reduced, and therefore, the breakdown of the nonvolatile memory element can be suppressed. Therefore, it was presumed that R0 satisfies desirably RL<R0 from experience.

[Effects]

In accordance with this embodiment, a nonvolatile memory apparatus and a nonvolatile memory element, which are capable of high-speed operation and have a stably reversible rewrite characteristic using a material which has high affinity with a semiconductor manufacturing process are attained.

Embodiment 2

A nonvolatile memory apparatus according to Embodiment 2 is a nonvolatile memory apparatus which includes the nonvolatile memory element according to Embodiment 1 and is a cross-point type memory apparatus in which an active layer intervenes at an intersection (three-dimensional cross point) between a word line and a bit line.

[Configuration of Semiconductor Apparatus According to Embodiment 2]

Figure 22:
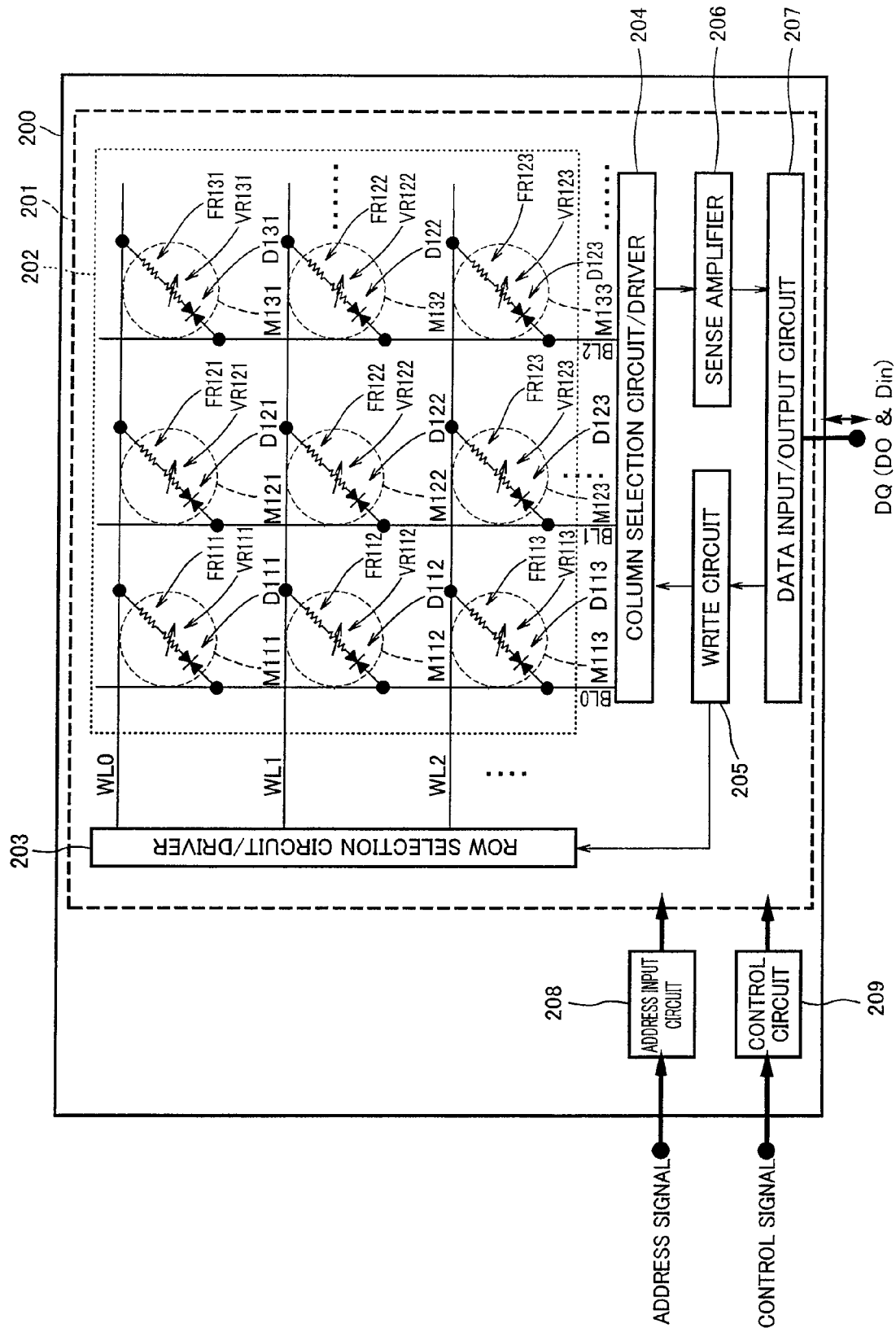
FIG. 22 is a block diagram showing a configuration of a nonvolatile memory apparatus according to Embodiment 2 of the present invention.

FIG. 22 is a block diagram showing a configuration of a nonvolatile memory apparatus according to Embodiment 2 of the present invention. As shown in FIG. 22, a nonvolatile memory apparatus 200 according to this embodiment includes a memory main body 201 on a semiconductor substrate. The memory main body 201 includes a nonvolatile memory element array 202 (memory cell array), a row selection circuit/driver 203, a column selection circuit/driver 204, a write circuit 205 for writing data, a sense amplifier 206 which detects an amount of a current flowing in a selected bit line and determines the data as "1" or "0" and a data input/output circuit 207 which executes input/output process of input/output data via a terminal DQ. The nonvolatile memory apparatus 200 further includes an address input circuit 208 which receives an address signal externally input, and a control circuit 209 for controlling the operation of the memory main body 201, based on a control signal externally input.

As shown in FIG. 22, the nonvolatile memory element array 202 includes a plurality of word lines WL0, WL1, WL2, ... (first electrode wires) which are formed to extend in parallel with each other on a semiconductor substrate, and a plurality of bit lines BL0, BL1, BL2, ... (second electrode wires) which are formed above or below the plurality of word lines WL0, WL1, WL2, ..., so as to extend in parallel with each other within a plane parallel to a main surface of the semiconductor substrate and so as to three-dimensionally cross the plurality of word lines WL0, WL1, WL2, .... That is, the word lines WL0, WL1, WL2 ... and the bit lines BL0, BL1, BL2, ... are provided on two different planes which are parallel to the main surface of the semiconductor substrate.

Further, a plurality of memory cells M111, M112, M113, M121, M122, M123, M131, M132, M133, ... (hereinafter referred to as "memory cells M111, MC112, ... ") are provided in matrix so as to respectively correspond to the three-dimensional cross points of the plurality of word lines WL0, WL1, WL2, ..., and the plurality of bit lines BL0, BL1, BL2 ....

The address input circuit 208 receives an address signal from an external circuit (not shown), and outputs a row address signal and a column address signal to the row selection circuit/driver 203 and to the column selection circuit/driver 204, respectively, based on the address signal. The address signal is a signal indicating the address of a specified memory cell to be selected from among the plurality of memory cells M111, M112, .... The row address signal is a signal indicating the address of a row in the address indicated by the address signal, and the column address signal is a signal indicating the address of a column in the address indicated by the address signal.

In a write cycle of data, the control circuit 209 outputs to the write circuit 205, a write signal for causing application of a write voltage, according to the input data Din input to the data input/output circuit 207. In a readout cycle of data, the control circuit 209 outputs to the column selection circuit/driver 204, a readout signal for causing application of a readout voltage.

The row selection circuit/driver 203 receives the row address signal output from the address input circuit 208, selects one from among the plurality of word lines WL0, WL1, WL2, ... based on the row address signal and applies a predetermined voltage to the selected word line.

The column selection circuit/driver 204 receives a column address signal output from the address input circuit 208, selects one from among the plurality of bit lines BL0, BL1, BL2, ... based on the column address signal and applies the write voltage or the readout voltage to the selected bit line.

Receiving the write signal output from the control circuit 209, the write circuit 205 outputs to the row selection circuit/driver 203, a signal for causing application of a voltage to the selected word line, and outputs to the column selection circuit/driver 204 a signal for causing application of a write voltage to the selected bit line. With such an operation, the electric pulse is applied only to the memory cell (selected memory cell) connected to both of the selected word line and the selected bit line.

In the readout cycle of data, the sense amplifier 206 detects an amount of a current flowing in the selected bit line which is a readout target, and determines the data as "1" or "0." The resulting output data DO is output to the external circuit via the data input/output circuit 207.

Each of the memory cells M111, M112, ... includes an associated one of rectifier elements D111, D112, D113, D122, D123, D131, D132, D133, ... (hereinafter expressed as "rectifier elements D111, D112, .... "), an associated one of nonvolatile memory portions VR111, VR112, VR113, VR122, VR123, VR131, VR132, VR133, ... (hereinafter expressed as "nonvolatile memory portions VR111, VR112, ... ") corresponding to the nonvolatile memory portion 108 according to Embodiment 1, and an associated one of fixed resistance portions FR111, FR112, FR113, FR122, FR123, FR131, FR132, FR133, ... (hereinafter expressed as "fixed resistance portions FR111, FR112, ... ") corresponding to the fixed resistance portion 109 according to Embodiment 1. Each of the rectifier elements D111, D112, ... , an associated one of the nonvolatile memory portions VR111, VR112, ... and an associated one of the fixed resistance portions FR111, FR112, ... are connected in series, and electrically connects an associated one of the bit lines BL0, BL1, BL2, ... to an associated one of the word lines WL0, WL1, WL2, .... A part of each of the word lines WL0, WL1, WL2, ... may form the second electrode of FIG. 4. The second electrode of FIG. 4 may be provided for each memory cell M, separately from an associated one of the word lines WL0, WL1, WL2, The order and direction for connecting the fixed resistance portions FR111, FR112, ... the nonvolatile memory portions VR111, VR112, ... and the rectifier elements D111, D112, ... are not limited. For example, each of the nonvolatile memory portions VR111, VR112, ... may be connected to an associated one of the bit lines BL0, BL1, BL2, .... In that case, a part of the bit lines BL0, BL1, BL2, ... may form the first electrode of FIG. 4. The first electrode of FIG. 4 may be provided for each memory cell M, separately from an associated one of the word lines WL0, WL2, WL2, ... and an associated one of the bit lines BL0, BL1, BL2, ....

Each of the nonvolatile memory portions VR111, VR112, ... and the associated one of the fixed resistance portions FR111, FR 112, ... form a pair to constitute the nonvolatile memory element shown in FIG. 4. Each of the nonvolatile memory portions VR111, VR112, ... has the variable resistance layer comprising tantalum oxide. $0 < x < 2.5$ is satisfied when the tantalum oxide is represented by $TaO_x$. Each of the fixed resistance portions FR111, FR112, ...

includes a fixed resistance layer. When the resistance value of the nonvolatile memory portions VR11, VR112, . . . in the high-resistance state is RH, the resistance value thereof in the low-resistance state is RL, and the resistance value of the fixed resistance portions FR111, FR112, . . . is R0, R0 satisfies RL<R0. Examples of specific numeric values may be such that RL is 300Ω. RH is $10^5$Ω, and R0 is 1000Ω.

In this embodiment, a portion of each of the word lines WL0, WL1, WL2, . . . which is connected to the row selection circuit/driver 203 corresponds to the first terminal 103 of FIG. 3, while a portion of each of the bit lines BL0, BL1, BL2, . . . which is connected to the column selection circuit/driver 204 corresponds to the second terminal 104 of FIG. 3. It should be noted that the first electrode, the second electrode, the first electrode wire, the second electrode wire, the first terminal, the second terminal, etc, are named for the sake of convenience, and a correspondence or vertical positional relationship are not limited to the above (the same is applied hereinbelow).

Figure 23:
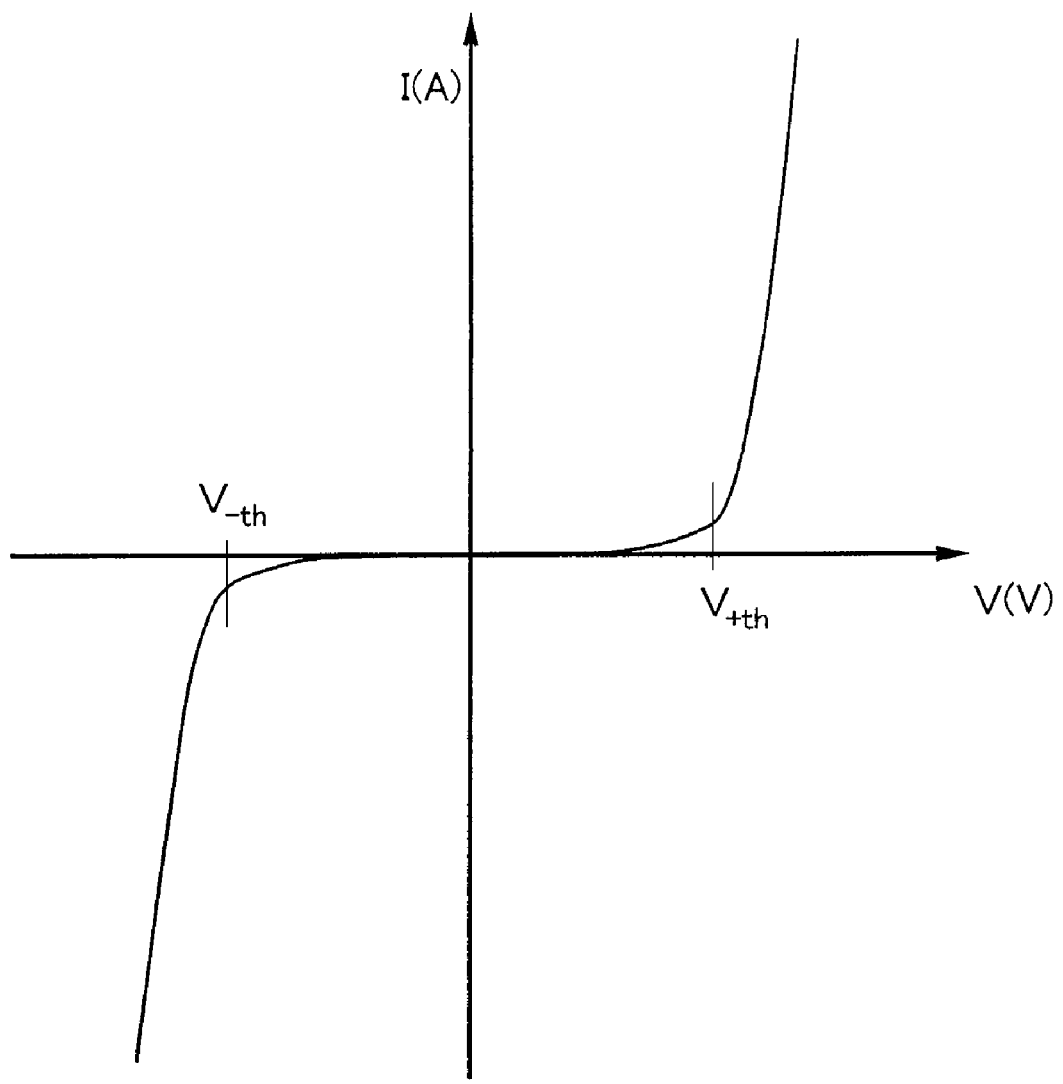
FIG. 23 is a view showing a voltage-current characteristic of rectifier elements D111, D112, . . . in the nonvolatile memory apparatus according to Embodiment 2 of the present invention.

FIG. 23 is a view showing a voltage-current characteristic of the rectifier elements D111, D112, . . . in the nonvolatile memory apparatus according to Embodiment 2 of the present invention. As shown in FIG. 23, the rectifier elements D111, D112, . . . have a bidirectional voltage-current characteristic in which resistance is very high in a range where a voltage V satisfies V>V+th or V<V−th and substantially become insulators. In the cross-point type memory cell array, there arises a problem that a current flows in a memory cell which is not a write target or a readout target (so-called leak current occurs), or a specified memory cell is affected by its adjacent memory cells (so-called crosstalk occurs) when writing and reading out are performed with respect to the specified memory cell. In this embodiment, by providing the rectifier elements D111, D112, . . . having the characteristic shown in FIG. 23, hindrance such as the leak current or the crosstalk can be suppressed.

In this embodiment, it is assumed that only the resistance values of the variable resistance layers included in the nonvolatile memory portions VR111, VR112, . . . and only the resistance values of the fixed resistance layers included in the fixed resistance portions FR111, FR112, . . . in the memory cells M111, M112, . . . , in current paths connecting the word lines WL0, WL1, WL2, . . . to the bit lines BL0, BL1, BL2, . . . , should be taken into account and the resistance values of the other portions may be negligible.

[Operation of Semiconductor Apparatus According to Embodiment 2]

Subsequently, an example of an operation of the nonvolatile memory apparatus according to Embodiment 2 during writing and during readout will be described with reference to FIG. 22. Hereinafter, it is assumed that an event that the variable resistance layer is in the high-resistance state is assigned to data "1" and an event that the variable resistance layer is in the low-resistance state is assigned to data "0." However, a correlation between the resistance state and data is not limited to this (hereinafter the same is applied).

During the readout, an address signal indicating an address of a memory cell from which data should be read out is externally input to the address input circuit 208, and a control signal indicating that the data read-out operation should be performed and the associated timing is externally input to the control circuit 209.

Based on the input signals, the row selection circuit/driver 203 and the column selection circuit/driver 204 select a word line WL and a bit line BL corresponding to the memory cell from which the data should be read out. When selection of the memory cell is completed, the readout voltage is applied to the selected word line WL and the selected bit line BL at a predetermined timing under control of the control circuit 209. The sense amplifier 206 detects an amount of a current flowing in the selected bit line BL. It is determined whether the resistance state of the memory cell is the high-resistance state or the low-resistance state, based on the detected current amount. When the memory cell is in the high-resistance state, it is determined that the data written in the memory cell is "1," and the data input/output circuit 207 outputs output data DO indicating "1." When the memory cell is in the low-resistance state, it is determined that the data written in the memory cell is "0," and the data input/output circuit 207 outputs output data DO indicating "0."

During the writing, an address signal indicating an address of a memory cell in which data should be written is externally input to the address input circuit 208, a control signal indicating that data write operation should be performed and the associated timing is externally input to the control circuit 209, and a signal (Din) indicating data "1" or "0" to be written is externally input to the data input/output circuit 207.

Based on the input signals, the row selection circuit/driver 203 and the column selection circuit/driver 204 select a word line WL and a bit line BL, respectively corresponding to the memory cell in which the data should be written. When selection of the memory cell is completed, the write circuit 205 applies an electric pulse at a predetermined timing under control of the control circuit 209.

When the data to be written is "1," the write circuit 205 outputs as the high-resistance state attaining pulse, for example, rectangular pulses whose voltage is −3.5V and whose pulse width is 100 nsec, in order to turn the nonvolatile memory portion VR to the high-resistance state. The high-resistance state attaining pulse is applied to the selected memory cell via the row selection circuit/driver 203, the selected word line WL, the column selection circuit/driver 204, and the selected bit line BL. The resistance value of the rectifier element D included in the memory cell is negligible because the applied voltage is sufficiently high. Therefore, the high-resistance state attaining pulse is applied to both ends of the nonvolatile memory element consisting of the nonvolatile memory portion VR and the fixed resistance portion FR. The voltage is divided between the nonvolatile memory portion VR and the fixed resistance portion FR, and a predetermined voltage is applied to the variable resistance layer of the nonvolatile memory portion VR. With such an operation, the variable resistance layer of the nonvolatile memory portion VR included in the selected memory cell turns to the high-resistance state. When the variable resistance layer is in the high-resistance state, the resistance value of the variable resistance layer does not vary (FIG. 17). When the variable resistance layer is in the low-resistance state, the resistance value of the variable resistance later varies to the resistance value of the high-resistance state.

When the data to be written is "0," the write circuit 205 outputs as the low-resistance state attaining pulse, for example, rectangular pulses whose voltage is +3V and whose pulse width is 100 nsec, in order to turn the nonvolatile memory portion VR to the low-resistance state. The low-resistance state attaining pulse is applied to the selected memory cell via the row selection circuit/driver 203, the selected word line WL, the column selection circuit/driver 204, and the selected bit line BL. The resistance value of the rectifier element D included in the memory cell is negligible because the applied voltage is sufficiently high. Therefore, the low-resistance state attaining pulse is applied to both ends of the nonvolatile memory element consisting of the nonvolatile memory portion VR and the fixed resistance portion FR.

The voltage is divided between the nonvolatile memory portion VR and the fixed resistance portion FR, and a predetermined voltage is applied to the variable resistance layer of the nonvolatile memory portion VR. With such an operation, the variable resistance layer of the nonvolatile memory portion VR included in the selected memory cell turns to the low-resistance state. When the variable resistance layer is in the low-resistance state, the resistance value of the variable resistance layer does not vary (FIG. 17). When the variable resistance layer is in the high-resistance state, the resistance value of the variable resistance later varies to the resistance value of the low-resistance state.

[Effects]

In this embodiment, since the fixed resistance portion FR is connected in series to the nonvolatile memory portion VR in each memory cell, break down which tends to occur when the variable resistance layer changes to the low-resistance state can be prevented. In accordance with this embodiment, a nonvolatile memory element array and a nonvolatile memory apparatus, which are capable of high-speed operation and have a stably reversible rewrite characteristic using a material which has high affinity with a semiconductor manufacturing process are attained.

In this embodiment, since the cross-point type nonvolatile memory element array and the cross-point type nonvolatile memory apparatus are employed, a memory apparatus which has elements whose areas are small, is highly integrated, has a large capacity and is small-sized is attained.

As already described in Embodiment 1, in the case where the variable resistance layer including the tantalum oxide of the present invention is used, the resistance varying phenomenon can be confirmed even when the electric pulses applied between the electrodes is a high-speed pulse having a width of about 20 nsec. Therefore, the pulse width may be set to about 50 nsec. If the high-speed pulse having a pulse width of about 50 nsec, one write cycle time can be set to about 80 nsec, taking operation time of a peripheral circuit such as a control circuit of the nonvolatile memory apparatus 200 into account. In that case, for example, when input/output of data to/from a component outside the nonvolatile memory apparatus 200 via the terminal DQ of the data input/output circuit 207, is performed with 16 bits, a data transfer speed required for writing the data is 25 Mbite per second, achieving a very high-speed write operation. Furthermore, a higher-speed write operation can be achieved by increasing parallel write bits in number inside the nonvolatile memory apparatus, by using a known method such as a page mode or a burst mode.

Among conventional nonvolatile memories, in the case of a NAND flash memory which is known to be capable of data transfer at a relatively high speed, a data transfer speed required for writing is about 10 Mbites per second, even if the page mode is used. From this fact, achievement of the high-speed of the write operation of the nonvolatile memory apparatus according to this embodiment can be confirmed.

As already described in Embodiment 1, by using the variable resistance layer including the tantalum oxide of the present invention, the nonvolatile memory element which has a low imprinting characteristic can be attained. To be specific, even in the case where, after the same data is repeatedly written, opposite data is written, rewriting can be performed by applying a high-speed pulse once. This eliminates a need for a step for adjusting different data to identical ones before writing, which commonly occurs in a delete cycle or a reset cycle which is typically needed in the nonvolatile memory element. This contributes to achievement of a higher-speed of the writing in the nonvolatile memory apparatus according to this embodiment. Since such a step is dispensed with, the write operation can be performed with a simple step.

Since a voltage which is as low as 2 to 3V is sufficient as the write voltage, low electric power consumption can be realized.

Although not shown in this embodiment, a memory apparatus is typically provided with redundant aid memory cells having the same structure as the memory cells to aid defective memory cells. Also, memory cells for parity bits for error correction are provided in a part of a memory array, or a memory array comprising the parity bit memory cells is additionally provided. In this embodiment, such memory cells may be additionally provided. In that case, as such cells, the nonvolatile memory elements of the present invention may be used. Whereas the case where the voltage values are made different between the high-resistance state attaining pulse and the low-resistance state attaining pulse is illustrated, it sometimes happens that an optimal pulse voltage value is equal in the voltage value of the high-resistance state attaining pulse and the voltage value of the low-resistance state attaining pulse. In such cases, the voltage value of the high-resistance state attaining pulse and the voltage value of the low-resistance state attaining pulse may be made equal to each other.

In this embodiment, only the cross point structure formed by integration on the semiconductor substrate is described. Alternatively, the cross point structure may be formed on a more inexpensive substrate such as a plastic substrate, in place of the semiconductor substrate, and may be applied to a memory apparatus which has a layered structure formed by an assembling method using bumps.

In this embodiment, the nonvolatile memory element arrays may be formed into a layered structure. As already described in Embodiment 1, the variable resistance layer of the present invention can be formed at a low temperature. Therefore, since wire member or material such as transistors or silicide formed in a lower layer step are not affected even when forming a layered structure is performed in a wiring step illustrated in this embodiment. As a result, a multi-layered memory array can be easily attained. That is, a nonvolatile semiconductor apparatus having a multi-layered structure can be easily attained by using the variable resistance layer comprising the tantalum oxide of the present invention.

[Modification]

A nonvolatile memory apparatus 200' according to this modification has a structure in which the fixed resistance portions FR111, FR112, ... are excluded from the memory cells M111, M112, ... and instead fixed resistance elements FR20, FR21, FR22, ... are respectively provided on the bit lines BL0, BL1, BL2, ... in the nonvolatile memory apparatus 200. Since the other respects of the nonvolatile memory apparatus according to this modification are identical to those of the nonvolatile memory apparatus 200, common components are identified by the same reference numerals and the same names, and will not be further described.

Figure 24:
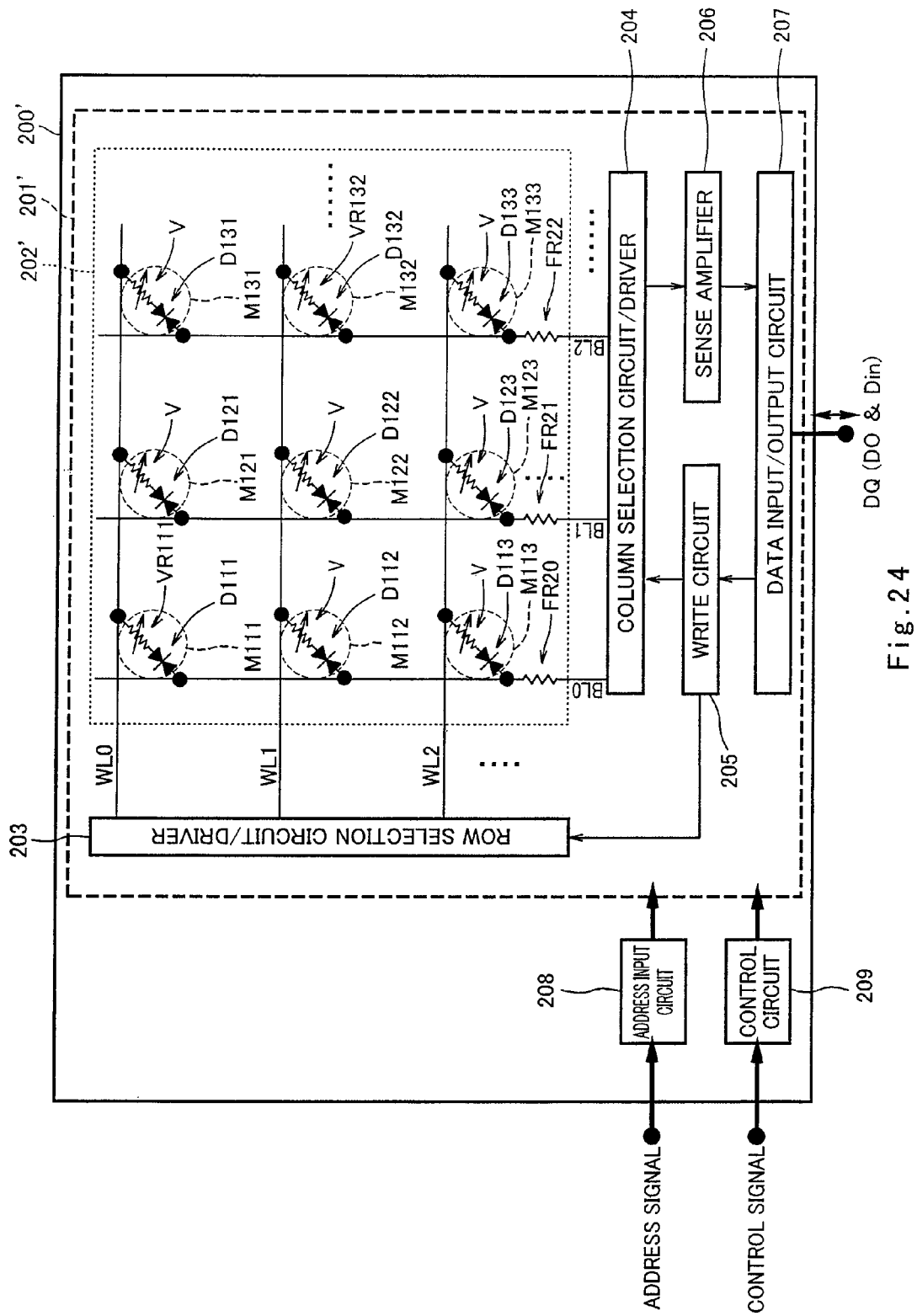
FIG. 24 is a block diagram showing a configuration of a nonvolatile memory apparatus according to Modification of Embodiment 2 of the present invention.

FIG. 24 is a block diagram showing a configuration of a nonvolatile memory apparatus according to Modification of Embodiment 2 of the present invention. As shown in FIG. 24, a nonvolatile memory apparatus 200' according to this modification includes a memory main body 201' on a semiconductor substrate. The memory main body 201' includes a nonvolatile memory element array 202' (memory cell array), the row selection circuit/driver 203, the column selection circuit/driver 204, the write circuit 205, the sense amplifier 206, and the data input/output circuit 207. The nonvolatile memory apparatus 200' further includes the address input circuit 208, and the control circuit 209.

Each of the memory cells M111, M112, . . . includes an associated one of the rectifier elements D111, D112, . . . , an associated one of the nonvolatile memory elements VR111', VR112', VR113', VR122', VR123', VR131', VR132', VR133', . . . (hereinafter expressed as "nonvolatile memory elements VR111', VR112', . . . ") corresponding to the nonvolatile memory element 101 according to Embodiment 1. Each of the rectifier elements D111, D112, . . . , and an associated one of the nonvolatile memory elements VR 111', VR112', . . . are connected in series, and electrically connect an associated one of the bit lines BL0, BL1, BL2, . . . to an associated one of the word lines WL0, WL1, WL2, . . . . A part of each of the word lines WL0, WL1, WL2, . . . may form the first electrode or the second electrode of FIG. 2. The first electrode or the second electrode of FIG. 2 may be provided for each memory cell M, separately from an associated one of the word lines WL0, WL1, WL2, . . . . The order and direction for connecting the nonvolatile memory elements VR111', VR112', . . . and the rectifier elements DI11, D112, . . . are not limited. For example, each of the nonvolatile memory elements VR111', VR112', . . . may be connected to an associated one of the bit lines BL0, BL1, BL2, . . . . In that case, a part of the bit lines BL0, BL1, BL2, . . . may form the first electrode or the second electrode of FIG. 2. The first electrode or the second electrode of FIG. 2 may be provided for each memory cell M, separately from an associated one of the bit lines BL0, BL1, BL2, . . . .

Fixed resistance elements FR20, FR21, FR22 . . . (resistors) are respectively provided at portions of the bit lines BL0, BL1, BL2, . . . which are connected to the column selection circuit/driver 204. The fixed resistance elements FR20, FR21, FR22 . . . may be respectively provided at portions of the word lines WL0, WL1, WL2, . . . which are connected to the row selection circuit/driver 203.

Each of the nonvolatile memory elements VR111', VR112', . . . has the variable resistance layer comprising tantalum oxide. 0<x<2.5 is satisfied when the tantalum oxide is represented by TaOx. When the resistance value of the nonvolatile memory elements VR111', VR112', . . . in the high-resistance state is RH, the resistance value thereof in the low-resistance state is RL, and the resistance value of the fixed resistance elements FR20, FR21, FR22 . . . is R0, R0 satisfies RL<R0. Examples of specific numeric values may be such that RL is 300Ω, RH is $10^5$Ω, and R0 is 1000Ω.

In this embodiment, it is assumed that only resistance values of the variable resistance layers included in the nonvolatile memory elements VR111', VR112', . . . in the memory cells M111, M112, . . . , and only the resistance values of the fixed resistance elements FR20, FR21, FR22 . . . , in current paths connecting the word lines WL0, WL1, WL2, . . . to the bit lines BL0, BL1, and BL2, . . . should be taken into account and the resistance values of the other portions may be negligible.

The operation of the nonvolatile memory apparatus 200' according to this modification is made similar to the operation of the nonvolatile memory apparatus 200 by replacing the "nonvolatile memory portion" by the "nonvolatile memory element" and by replacing the "fixed resistance portion" by the "fixed resistance element" in the above description, and therefore will not be further described.

Since the fixed resistance element FR is connected in series to the nonvolatile memory element VR in each memory cell in this modification, the breakdown which tends to occur when the variable resistance layer changes to the low-resistance state can be prevented. According to this modification, a nonvolatile memory element array and a nonvolatile memory apparatus, which are capable of high-speed operation and have a stably reversible rewrite characteristic using a material which has high affinity with a semiconductor manufacturing process, are attained.

Since providing resistors which are fewer in number is sufficient in this modification, as compared to the configuration in which the fixed resistance portion is provided in each memory cell M, manufacturing becomes easier.

In this modification, it is needless to say that the advantages of the above described embodiments are achieved.

Embodiment 3

A nonvolatile memory apparatus according to Embodiment 3 is a nonvolatile memory apparatus which includes the nonvolatile memory element according to Embodiment 1, and is of a one transistor/one nonvolatile memory portion type (1T/1R type).

[Configuration of Nonvolatile Memory Apparatus According to Embodiment 3]

Figure 25:
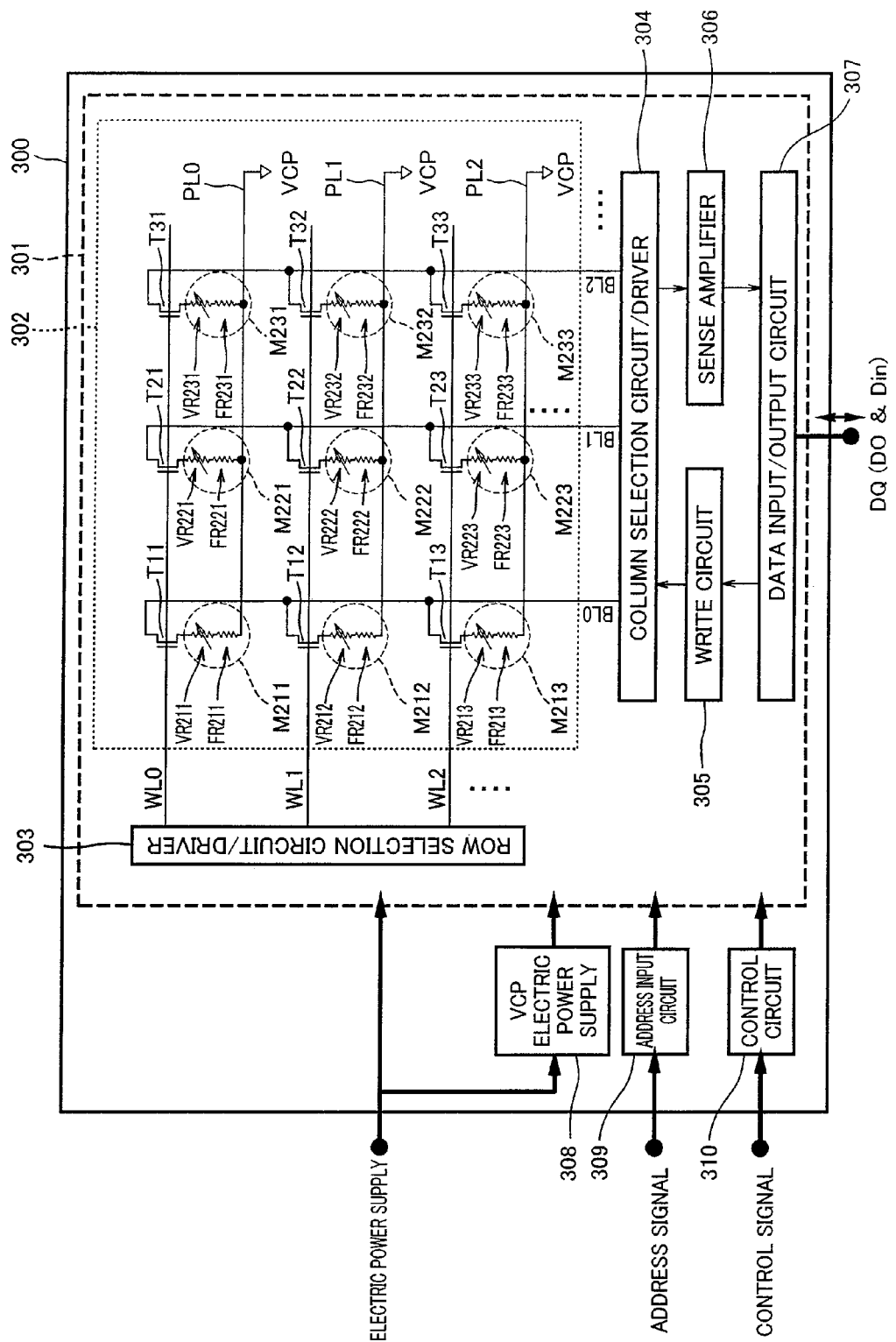
FIG. 25 is a block diagram showing a configuration of a nonvolatile memory apparatus according to Embodiment 3 of the present invention.

FIG. 25 is a block diagram showing a configuration of a nonvolatile memory apparatus according to Embodiment 3 of the present invention. As shown in FIG. 25, a nonvolatile memory apparatus 300 according to this embodiment includes a memory main body 301 on a semiconductor substrate. The memory main body 301 includes a nonvolatile memory element array 302 (memory cell array), a row selection circuit/driver 303, a column selection circuit/driver 304, a write circuit 305 for writing data, a sense amplifier 306 which detects an amount of a current flowing in a selected bit line and determines the data as "1" or "0," and a data input/output circuit 307 which executes input/output process of input/output data via the terminal DQ. The nonvolatile memory apparatus 300 further includes a cell plate electric power supply (VCP electric power supply) 308, an address input circuit 309 which receives an address signal externally input, and a control circuit 310 for controlling the operation of the memory main body 301, based on the control signal externally input.

The nonvolatile memory element array 302 includes the plurality of word lines WL0, WL1, WL2, . . . and the plurality of bit lines BL0, BL1, BL2, . . . which are formed on the semiconductor substrate and are arranged to three-dimensionally cross each other, a plurality of transistors T11, T12, T13, T21, T22, T23, T31, T32, T33, . . . (hereinafter expressed as "transistors T11, T12, . . . ") provided to respectively correspond to intersections of the word lines WL0, WL1, WL2, . . . and the bit lines BL0, BL1, BL2, and a plurality of memory cells M211, M212, M213, M221, M222, M223, M231, M232, N233 (hereinafter expressed as "memory cells M211, M212, . . . " provided to respectively correspond to the transistors T11, T12, . . . . The word lines WL0, WL1, WL2 . . . and the bit lines BL0, BL1, BL2, . . . are provided on two different planes which are parallel to the main surface of the semiconductor substrate.

The nonvolatile memory element array 302 further includes a plurality of plate lines PL, PL1, PL2, . . . which are arranged to extend in parallel with the word lines WL0, WL1, WL2, . . . and to respectively correspond to the word lines WL0, WL1, WL2, . . . . The plate lines PL0, PL1, PL2, . . . may be provided on the same plane as the plane (plane parallel to the main surface of the semiconductor substrate) on which the word lines WL0, WL1, WL2, . . . are provided, or otherwise may be provided on another plane (plane parallel to the main surface of the semiconductor substrate).

As shown in FIG. 25, drains (first main terminals) of the transistors T11, T12, T13, . . . are connected to the bit line BL0, drains of the transistors T21, T22, T23, . . . are connected to the bit line BL1, and drains of the transistors T31, T32, T33, . . . are connected to the bit line BL2.

Gates (control terminals) of the transistors T11, T21, T31, . . . are connected to the word line WL0, gates of the transistors T12, T22, T32 . . . are connected to the word line WL1, and gates of the transistors T13, T23, T33, . . . are connected to the word line WL2.

Sources (second main terminals) of the transistors T11, T12, . . . are connected to the memory cells M211, M212, . . . , respectively. Note that connection targets may be reversed between the drains and the sources of the transistors.

The memory cells M211, M221, M231, . . . are connected to the plate line PL0, the memory cells M212, M222, M232, . . . are connected to the plate line PL1, and the memory cells M212, M223, M233, . . . are connected to the plate line PL2.

The address input circuit 309 receives an address signal from an external circuit (not shown), and outputs a row address signal and a column address signal to the row selection circuit/driver 303 and the column selection circuit/driver 304, respectively, based on the address signal. The address signal is a signal indicating the address of a specified memory cell to be selected from among the plurality of memory cells M211, M212, . . . . The row address signal is a signal indicating the address of a row in the address indicated by the address signal, and the column address signal is a signal indicating the address of a column in the address indicated by the address signal.

In a write cycle of data, the control circuit 310 outputs to the write circuit 305, a write signal for causing application of a write voltage, according to the input data Din input to the data input/output circuit 307. On the other hand, in a readout cycle of data, the control circuit 310 outputs to the column selection circuit/driver 304, a readout signal for causing application of a readout voltage.

The row selection circuit/driver 303 receives the row address signal output from the address input circuit 309, selects one from among the plurality of word lines WL0, WL1, WL2, . . . according to the row address signal, and applies a predetermined voltage (ON voltage) to the selected word line.

The column selection circuit/driver 304 receives a column address signal output from the address input circuit 309, selects one from among the plurality bit lines BL0, BL1, BL2, . . . according to the column address signal and applies the write voltage or the readout voltage to the selected bit line.

Receiving the write signal output from the control circuit 310, the write circuit 305 outputs to the column selection circuit/driver 304, a signal for causing application of the write voltage to the selected bit line. With such an operation, the electric pulse is applied only to the memory cell (selected memory cell) connected to both the selected word line and the selected bit line.

In the readout cycle of data, the sense amplifier 306 detects an amount of a current flowing in the selected bit line which is a readout target, and determines the data as "1" or "0." The resulting output data DO is output to the external circuit via the data input/output circuit 307.

Each of the memory cells M111, M112, . . . is a nonvolatile memory element including an associated one of nonvolatile memory portions VR211, VR212, VR213, VR222, VR223, VR231, VR232, VR233, . . . (hereinafter expressed as "nonvolatile memory portions VR211, VR212, . . . ") corresponding to the nonvolatile memory portion 108 according to Embodiment 1, and an associated one of fixed resistance portions FR211, FR212, FR213, FR222, FR223, FR231, FR232, FR233, . . . (hereinafter expressed as the "fixed resistance portions FR211, FR212, . . . ") corresponding to the fixed resistance portion 109.

Two main terminals of each of the transistors T11, T12, T31, . . . an associated one of the nonvolatile memory portions VR211, VR212, . . . , and an associated one of the fixed resistance portions FR211, FR212, . . . are connected in series, and electrically connect an associated one of the bit lines BL0, BL1, BL2, . . . to an associated one of the word lines WL0, WL1, WL2, . . . . A part of each of the plate lines PL0, PL1, PL2, may form the second electrode of FIG. 4. The second electrode of FIG. 4 may be provided for each memory cell M, separately from an associated one of the plate lines PL0, PL2, PL2, . . . . The order and direction for connecting the transistors T11, T12, T31, . . . the nonvolatile memory portions VR211, VR212, . . . and the fixed resistance portions VR211, VR212, . . . are not limited. For example, each of the nonvolatile memory portions VR211, VR212, . . . may be connected to an associated one of the bit lines BL0, BL1, BL2, . . . . In that case, a part of the bit lines BL0, BL1, BL2, . . . may form the first electrode of FIG. 4. The first electrode of FIG. 4 may be provided for each memory cell M, separately from an associated one of the bit lines BL0, BL1, BL2, . . . .

Each of the nonvolatile memory portions VR211, VR212, . . . and an associated one of the fixed resistance portions FR211, FR 212, . . . form a pair to constitute the nonvolatile memory element shown in FIG. 4. Each of the nonvolatile memory portions VR211, VR212, . . . has the variable resistance layer comprising tantalum oxide. $0<x<2.5$ is satisfied when the tantalum oxide is represented by TaOx. Each of the fixed resistance portions FR211, FR212, . . . includes a fixed resistance layer. When the resistance value of the nonvolatile memory portions VR211, VR212, . . . in the high-resistance state is RH, the resistance value thereof in the low-resistance state is RL, and the resistance value of the fixed resistance portions FR211, FR212, . . . is R0, R0 satisfies RL<R0. Examples of specific numeric values may be such that RL is 300Ω, RH is $10^5$Ω, and R0 is 1000Ω.

In this embodiment, a portion of each of the word lines WL0, WL1, WL2, . . . which is connected to the row selection circuit/driver 303 corresponds to the first terminal 103 of FIG. 3, while a portion of each of the bit lines BL0, BL1, BL2, . . . which is connected to the column selection circuit/driver 304 corresponds to the second terminal 104 of FIG. 3. It should be noted that the first electrode, the second electrode, the first electrode wire, the second electrode wire, the first terminal, the second terminal, etc, are named for the sake of convenience, and a correspondence or vertical positional relationship are not limited to the above (the same is applied hereinbelow).

[Operation of Semiconductor Apparatus According to Embodiment 3]

Subsequently, an example of an operation of the nonvolatile memory apparatus according to Embodiment 3 during the writing and during the readout will be described with reference to FIG. 25.

During the readout, an address signal indicating an address of a memory cell from which data should be read out is externally input to the address input circuit 309, and a control signal indicating that data read-out operation should be performed and the associated timing is externally input to the control circuit 310.

Based on the input signals, the row selection circuit/driver 303 and the column selection circuit/driver 304 select a word line WL and a bit line BL corresponding to the memory cell from which the data should be read out. A predetermined voltage is applied to the selected word line WL via the row selection circuit/driver 303, causing the transistor T connected to the word line WL to be turned to an ON-state. When selection of the memory cell is completed, the readout voltage is applied to the selected bit line BL at a predetermined timing under control of the control circuit 310. The sense amplifier 306 detects the amount of a current flowing in the selected bit line BL. Based on the detected current amount, it is determined that resistance state of the selected memory cell is the high-resistance state or the low-resistance state. When the memory cell is in the high-resistance state, it is determined that the data written in the memory cell is "1," and the data input/output circuit 307 outputs output data DO indicating "1." When the memory cell is in the low-resistance state, it is determined that the data written in the memory cell is "0," and the data input/output circuit 307 outputs output data DO indicating "0."

During the writing, an address signal indicating an address of a memory cell in which data should be written is externally input to the address input circuit 309, a control signal indicating that data write operation should be performed and the associated timing is externally input to the control circuit 310, and a signal (Din) indicating data ("1" or "0") to be written is externally input to the data input/output circuit 307.

Based on the input signals, the row selection circuit/driver 303 and the column selection circuit/driver 304 select the word line WL and the bit line BL corresponding to the memory cell in which data should be written. A predetermined voltage is applied to the selected word line WL via the row selection circuit/driver 303, causing the transistor T connected to the word line WL to be tuned to an ON-state. In this embodiment, it is assumed that the resistance (ON-resistance) of the transistor in the ON-state is negligible. When selection of the memory cell is completed, the write circuit 205 applies an electric pulse at a predetermined timing under control of the control circuit 310.

When the data to be written is "1," the write circuit 305 outputs as the high-resistance state attaining pulse, for example, a rectangular pulse whose voltage is −3.5V and whose pulse width is 100 nsec, in order to turn the nonvolatile memory portion VR to the high-resistance state. The high-resistance state attaining pulse is applied to the selected memory cell via the column selection circuit/driver 304, the selected bit line BL, the plate line PL, and the VCP electric power supply 308. Therefore, the high-resistance state attaining pulse is applied to both ends of the nonvolatile memory element consisting of the nonvolatile memory portion VR and the fixed resistance portion FR. The voltage is divided between the nonvolatile memory portion VR and the fixed resistance portion FR, and a predetermined voltage is applied to the variable resistance layer of the nonvolatile memory portion VR. With such an operation, the variable resistance layer of the nonvolatile memory portion VR included in the selected memory cell turns to the high-resistance state. When the variable resistance layer is in the high-resistance state, the resistance value of the variable resistance layer does not vary (FIG. 17). When the variable resistance layer is in the low-resistance state, the resistance value of the variable resistance later varies to the resistance value of the high-resistance state.

When data to be written is "0," the write circuit 305 outputs as the low-resistance state attaining pulse, for example, a rectangular pulse whose voltage is +3V and whose pulse width is 100 nsec, in order to turn the nonvolatile memory portion VR to the low-resistance state. The low-resistance state attaining pulse is applied to the selected memory cell via the column selection circuit/driver 304, the selected bit line BL, the plate line PL, and the VCP electric power supply 308. Therefore, the low-resistance state attaining pulse is applied to both ends of the nonvolatile memory element consisting of the nonvolatile memory portion VR and the fixed resistance portion FR. The voltage is divided between the nonvolatile memory portion VR and the fixed resistance portion FR, and a predetermined voltage is applied to the variable resistance layer of the nonvolatile memory portion VR. With such an operation, the variable resistance layer of the nonvolatile memory portion VR included in the selected memory cell turns to the low-resistance state. When the variable resistance layer is in the low-resistance state, the resistance value of the variable resistance layer does not vary (FIG. 17). When the variable resistance layer is in the high-resistance state, the resistance value of the variable resistance later varies to the resistance value of the low-resistance state.

The fixed resistance portion FR may be omitted, and instead ON-resistance (resistance value between two main terminals in ON-state) of the transistors T11, T12, T31, . . . may be utilized. In this case, the ON-resistance is R0. The ON-resistance is suitably controllable depending on a specific design of the transistors T11, T12, T31, . . . and the magnitude of the ON-voltage. In such a configuration, since it is not necessary to provide the fixed resistance portion FR, a configuration is simplified.

[Effects]

Since the fixed resistance portion FR is connected in series to the nonvolatile memory element VR in each memory cell in this embodiment, breakdown which tends to occur when the variable resistance layer changes to the low-resistance state can be prevented. According to this embodiment, a nonvolatile memory element array and a nonvolatile memory apparatus, which are capable of high-speed operation and have a stably reversible rewrite characteristic using a material which has high affinity with a semiconductor manufacturing process are attained.

In this embodiment, the nonvolatile memory element array of 1T1R type and nonvolatile memory apparatus of 1T1R type are employed, and therefore the size of the apparatus is larger than that of the cross-point type if their capacities are equal, but problems such as leak current or crosstalk do not occur. They are easily combined with the CMOS process, and an operation control therefor is easier.

In this embodiment, also, it is needless to say that the advantages achieved in Embodiment 2 are attained, except for advantages peculiar to the cross-point type nonvolatile memory element array and the cross-point type nonvolatile memory apparatus. In this embodiment, also, it is needless to say that Modification similar to that of Embodiment 2 is possible, except for configuration peculiar to the cross-point type nonvolatile memory element array and the cross-point type nonvolatile memory apparatus.

[Modification]

A nonvolatile memory apparatus 300' according to this modification has a structure in which fixed resistance portions FR211, FR212, . . . are excluded from memory cells M211, M212, . . . , and instead fixed resistance elements FR30, FR31, FR32, . . . are respectively provided on the bit lines BL0, BL1, BL2, . . . in the nonvolatile memory apparatus 300. Since the other respects of the nonvolatile memory apparatus according to this modification are identical to those of the nonvolatile memory apparatus 300, common components are identified by the same reference numerals and the same names, and will not be further described.

Figure 26:
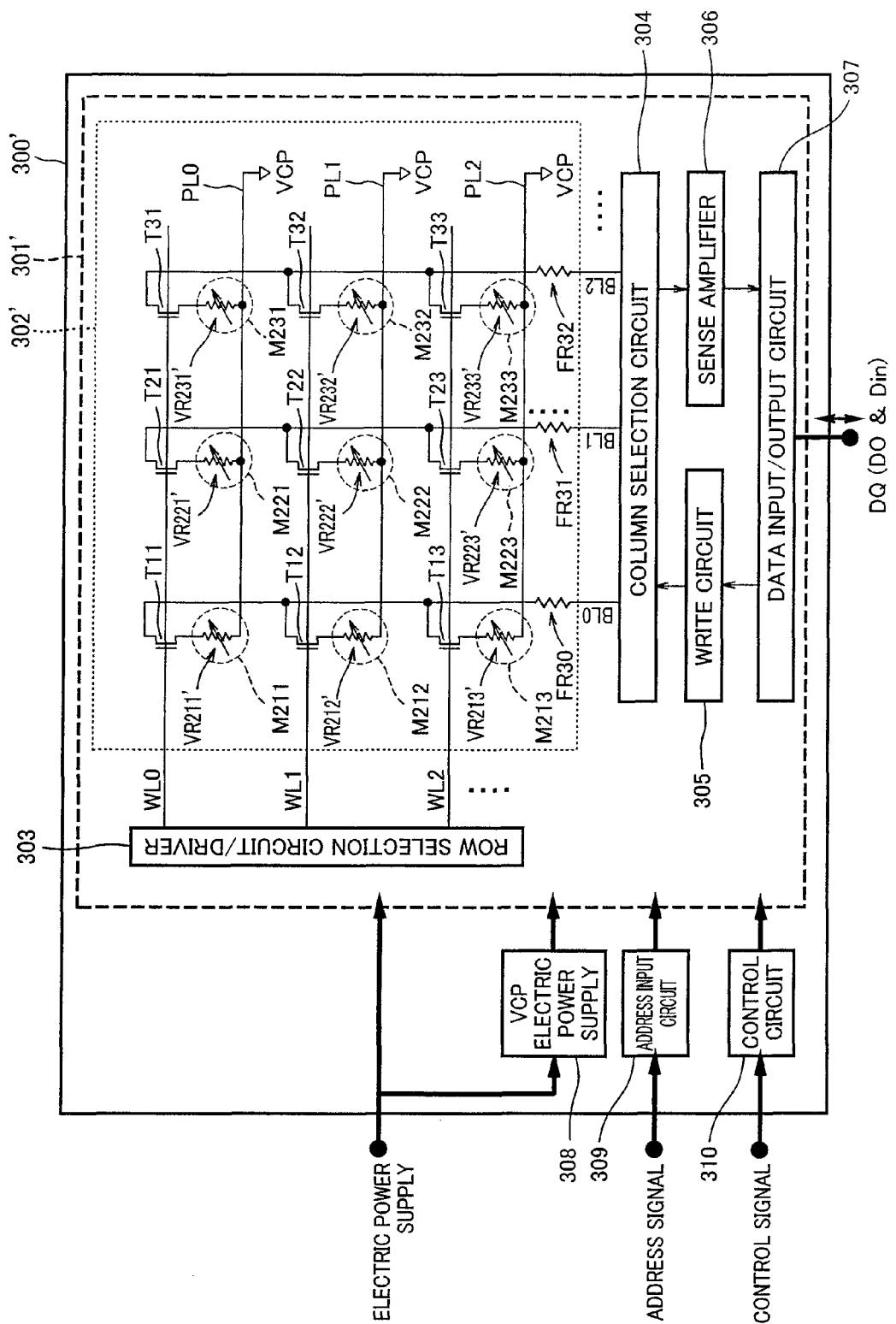
FIG. 26 is a block diagram showing a configuration of a nonvolatile memory apparatus according to Modification of Embodiment 3 of the present invention.
Figure 27:
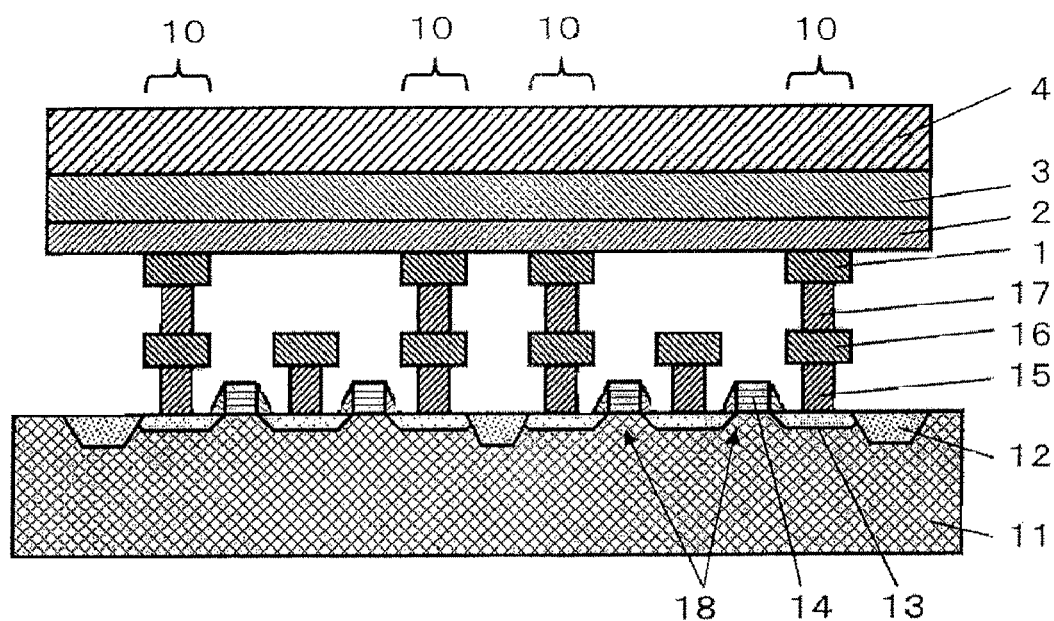
FIG. 27 is a cross-sectional view showing a configuration of a conventional memory element.

FIG. 26 is a block diagram showing a configuration of a nonvolatile memory apparatus according to Modification of Embodiment 3 of the present invention. As shown in FIG. 26, a nonvolatile memory apparatus 300' according to this modification includes a memory main body 301' on a semiconductor substrate. The memory main body 301' includes a nonvolatile memory element array 302' (memory cell array), the row selection circuit/driver 303, the column selection circuit/driver 304, the write circuit 305, the sense amplifier 306, and the data input/output circuit 307. The nonvolatile memory apparatus 300' further includes the VCP electric power supply 308, the address input circuit 309, and the control circuit 310.

The memory cells M211, M212, . . . are nonvolatile memory elements VR211', VR212', VR213', VR222', VR223', VR231', VR232', VR233', . . . (hereinafter expressed as "nonvolatile memory elements VR211', VR212', . . . ") corresponding to the nonvolatile memory element 101 of FIG. 2.

Two main terminals of each of the transistors T11, T12, . . . and an associated one of the nonvolatile memory elements VR111', VR112', . . . are connected in series, and electrically connect an associated one of the bit lines BL0, BL1, BL2, . . . to an associated one of the word lines WL0, WL1, WL2, . . . . A part of each of the plate lines PL0, PL1, PL2, . . . may form the first electrode or the second electrode of FIG. 4. The first electrode or the second electrode of FIG. 4 may be provided for each memory cell M, separately from an associated one of the plate lines PL0, PL1, PL2, . . . . The order and direction for connecting the transistors T11, T12, T31, . . . and the nonvolatile memory elements VR211', VR212', . . . are not limited. For example, each of the nonvolatile memory elements VR211', VR212', . . . may be connected to an associated one of the bit lines BL0, BL1, BL2, . . . . In that case, a part of each of the bit lines BL0, BL1, BL2, may form the first electrode or the second electrode of FIG. 4. The first electrode or the second electrode of FIG. 4 may be provided for each memory cell M, separately from an associated one of the bit lines BL0, BL1, BL2, . . . .

Fixed resistance elements FR30, FR31, FR32 . . . (resistors) are respectively provided at portions of the bit lines BL0, BL1, BL2, . . . which are connected to the column selection circuit/driver 204. The fixed resistance elements FR30, FR31, FR32 . . . may be respectively provided at portions of the word lines WL0, WL1, WL2, . . . which are connected to the row selection circuit/driver 303.

Each of the nonvolatile memory elements VR211', VR212', . . . has the variable resistance layer comprising tantalum oxide. 0<x<2.5 is satisfied when the tantalum oxide is represented by TaOx. When the resistance value of the nonvolatile memory elements VR211', VR212', . . . in the high-resistance state is RH, the resistance value thereof in the low-resistance state is RL, and the resistance value of the fixed resistance elements FR30, FR31, F32, . . . is R0, R0 satisfies RL<R0. Examples of specific numeric values may be such that RL is 300Ω. RH is $10^5$Ω, and R0 is 1000Ω.

In this embodiment, it is assumed that only resistance values of the variable resistance layers included in the nonvolatile memory elements VR211', VR212', . . . , in the memory cells M211, M212, . . . and only the resistance values of the fixed resistance elements FR30, FR31, FR32 . . . , in current paths connecting the word lines WL0, WL1, WL2, . . . to the bit lines BL0, BL1, BL2, . . . should be taken into account and the resistance values of the other portions may be negligible.

The operation of the nonvolatile memory apparatus 300' according to this modification is made similar to the operation of the nonvolatile memory apparatus 300 by replacing the "nonvolatile memory portion" by the "nonvolatile memory element" and by replacing the "fixed resistance portion" by the "fixed resistance element" in the above description, and therefore will not be further described.

Since the fixed resistance element FR is connected in series to the nonvolatile memory element VR in each memory cell in this modification, the breakdown which tends to occur when the variable resistance layer changes to the low-resistance state can be prevented. According to this modification, also, a nonvolatile memory element array and nonvolatile memory apparatus, which are capable of high-speed operation and have a stably reversible rewrite characteristic using a material which has high affinity with a semiconductor manufacturing process, are attained.

Since providing the resistors which are fewer in number is sufficient in this modification, as compared to the configuration in which the fixed resistance portion is provided in each memory cell M, manufacturing thereof becomes easier.

In this modification, it is needless to say that the advantages achieved by the above described embodiments is attained.

Numeral modifications and alternative embodiments of the present invention will be apparent to those skilled in the art in view of the foregoing description. Accordingly, the description is to be construed as illustrative only, and is provided for the purpose of teaching those skilled in the art the best mode of carrying out the invention. The details of the structure and/or function may be varied substantially without departing from the spirit of the invention.

INDUSTRIAL APPLICABILITY

A nonvolatile memory apparatus, a nonvolatile memory element, and a nonvolatile memory element array of the present invention are useful as a nonvolatile memory apparatus, a nonvolatile memory element, and a nonvolatile memory element array, which are capable of high-speed operation and have a stably reversible rewrite characteristic using a material which has high affinity with a semiconductor manufacturing process.

The invention claimed is:

1. A nonvolatile memory apparatus comprising:
a first electrode;
a second electrode;
a variable resistance layer which is disposed between the first electrode and the second electrode, a resistance value of the variable resistance layer reversibly varying between a plurality of resistance states based on an electric signal applied between the first electrode and the second electrode, the plurality of resistance states including a low-resistance state and a high-resistance state whose resistance value is higher than a resistance value of the low-resistance state;
a first terminal connected to the first electrode; and
a second terminal connected to the second electrode; wherein
the variable resistance layer comprises at least a tantalum oxide, and is configured to satisfy 0<x<2.5 when the tantalum oxide is represented by TaOx; and wherein
when a resistance value between the first electrode and the second electrode in a state where the variable resistance layer is in the low-resistance state is RL, a resistance value between the first electrode and the second electrode in a state where the variable resistance layer is in the high-resistance state is RH, and a resistance value of a portion other than the variable resistance layer in a current path connecting the first terminal to the second terminal via the first electrode, the variable resistance layer and the second electrode, is R0,
R0 satisfies RL<R0.

2. The nonvolatile memory apparatus according to claim 1, wherein
the variable resistance layer comprises at least a tantalum oxide, and is configured to satisfy 0<x≦1.9 when the tantalum oxide is represented by TaOx.

3. The nonvolatile memory apparatus according to claim 1, wherein the variable resistance layer comprises at least a tantalum oxide, and is configured to satisfy $0.5 \leq x \leq 1.9$ when the tantalum oxide is represented by TaOx.

4. The nonvolatile memory apparatus according to claim 1, wherein the variable resistance layer comprises at least a tantalum oxide, and is configured to satisfy $0.8 \leq x \leq 1.9$ when the tantalum oxide is represented by TaOx.

5. The nonvolatile memory apparatus according to claim 1, wherein a resistor is provided in series with the variable resistance layer in the current path;

and wherein when a resistance value of the resistor is R0, R0 satisfies RL<R0.

* * * * *

UNITED STATES PATENT AND TRADEMARK OFFICE
CERTIFICATE OF CORRECTION

PATENT NO. : 8,058,636 B2  Page 1 of 1
APPLICATION NO. : 12/302468
DATED : November 15, 2011
INVENTOR(S) : Koichi Osano et al.

It is certified that error appears in the above-identified patent and that said Letters Patent is hereby corrected as shown below:

On the Title Page, Item (57) Abstract, Line 8, change "second terminal" to

--second electrode--.

Signed and Sealed this
Twenty-sixth Day of June, 2012

David J. Kappos
*Director of the United States Patent and Trademark Office*